US011991815B2

(12) United States Patent
Igura et al.

(10) Patent No.: US 11,991,815 B2
(45) Date of Patent: May 21, 2024

(54) CIRCUIT STRUCTURE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Koushi Igura, Mie (JP); Hiroki Shimoda, Mie (JP); Taiji Yanagida, Mie (JP); Kazuya Komaki, Mie (JP); Ayaka Asano, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 254 days.

(21) Appl. No.: 17/623,781

(22) PCT Filed: Jun. 24, 2020

(86) PCT No.: PCT/JP2020/024880
§ 371 (c)(1),
(2) Date: Dec. 29, 2021

(87) PCT Pub. No.: WO2021/010119
PCT Pub. Date: Jan. 21, 2021

(65) Prior Publication Data
US 2022/0248524 A1     Aug. 4, 2022

(30) Foreign Application Priority Data

Jul. 15, 2019   (JP) ................................ 2019-130767
Jun. 8, 2020   (JP) ................................ 2020-099471

(51) Int. Cl.
H05K 7/20    (2006.01)
H05K 1/02    (2006.01)
H05K 5/00    (2006.01)

(52) U.S. Cl.
CPC ......... *H05K 1/0203* (2013.01); *H05K 5/0026* (2013.01); *H05K 7/2089* (2013.01); *H05K 2201/10272* (2013.01)

(58) Field of Classification Search
CPC .................................................. H05K 7/2089
See application file for complete search history.

(56) References Cited

U.S. PATENT DOCUMENTS

2017/0006731 A1*   1/2017   Higashi ................ H05K 5/0008
2017/0347485 A1*   11/2017   Ishii ..................... H02M 7/003
(Continued)

FOREIGN PATENT DOCUMENTS

JP   2014-079093   5/2014
JP   2019-169602   10/2019
WO   2018/105610   6/2018

*Primary Examiner* — Hung V Ngo
(74) *Attorney, Agent, or Firm* — Greenblum & Bernstein, P.L.C.

(57) ABSTRACT

Provided is a circuit structure having a novel structure that allows heat from a heat-generating component to be dissipated more efficiently. A circuit structure includes: a heat-generating component that generates heat when energized; energization bus bars that are connected to connection portions of the heat-generating component; cooling members that are formed separately from the energization bus bars, and are connected to the connection portions of the heat-generating component along with energization bus bars, and the heat-transfer portions that are provided in the cooling members, and are in heat-conductive contact with a heat-dissipating body.

14 Claims, 9 Drawing Sheets

(56) References Cited

U.S. PATENT DOCUMENTS

| | | | |
|---|---|---|---|
| 2018/0026545 A1* | 1/2018 | Numakura | H05K 7/02 361/689 |
| 2019/0297720 A1 | 9/2019 | Fujimura et al. | |
| 2019/0318892 A1 | 10/2019 | Ikejiri et al. | |

* cited by examiner

CIRCUIT STRUCTURE

TECHNICAL FIELD

The present disclosure relates to a circuit structure that includes a heat-generating component.

BACKGROUND ART

Conventionally, there are cases in which a heat-dissipating structure for dissipating heat from a heat-generating component is provided in a circuit structure including a heat-generating component such as a relay or fuse that generates heat when energized. For example, a structure in which heat from a relay that is housed inside a case is dissipated using an intermediate portion of a bus bar that connects a connection portion of the relay and a connection terminal of a battery that is arranged outside the case is proposed in Patent Document 1. Specifically, a structure is disclosed in which the intermediate portion of the bus bar, which is extended to the outside of the case housing the relay, is brought into contact with a chassis, a housing that houses an entire power supply device, or the like via an insulative heat conduction sheet, whereby heat generated by the relay is conducted to the chassis or the housing and dissipated.

CITATION LIST

Patent Documents

Patent Document 1: JP 2014-79093A

SUMMARY OF INVENTION

Technical Problem

However, in the structure disclosed in Patent Document 1, since the heat-dissipating structure is provided in the intermediate portion of the bus bar, which forms an energization portion connecting the relay and the battery, an increase in the distance between the connection portion of the relay and the heat-dissipating portion is unavoidable. Due to this, there is an inherent problem in which heat generated by the relay is not dissipated efficiently.

In view of this, the present disclosure aims to provide a circuit structure having a novel structure that allows heat from a heat-generating component to be dissipated more efficiently.

Solution to Problem

A circuit structure according to the present disclosure is a circuit structure including: a heat-generating component that generates heat when energized; an energization bus bar that is connected to a connection portion of the heat-generating component; a cooling member that is formed separately from the energization bus bar, and is connected to the connection portion of the heat-generating component along with the energization bus bar; and a heat transfer portion that is provided in the cooling member, and is in heat-conductive contact with a heat-dissipating body.

Advantageous Effects of Invention

According to the present disclosure, a circuit structure that allows heat from a heat-generating component to be dissipated more efficiently can be provided.

DESCRIPTION OF EMBODIMENTS

Description of Embodiments of Present Disclosure

Figure 1:
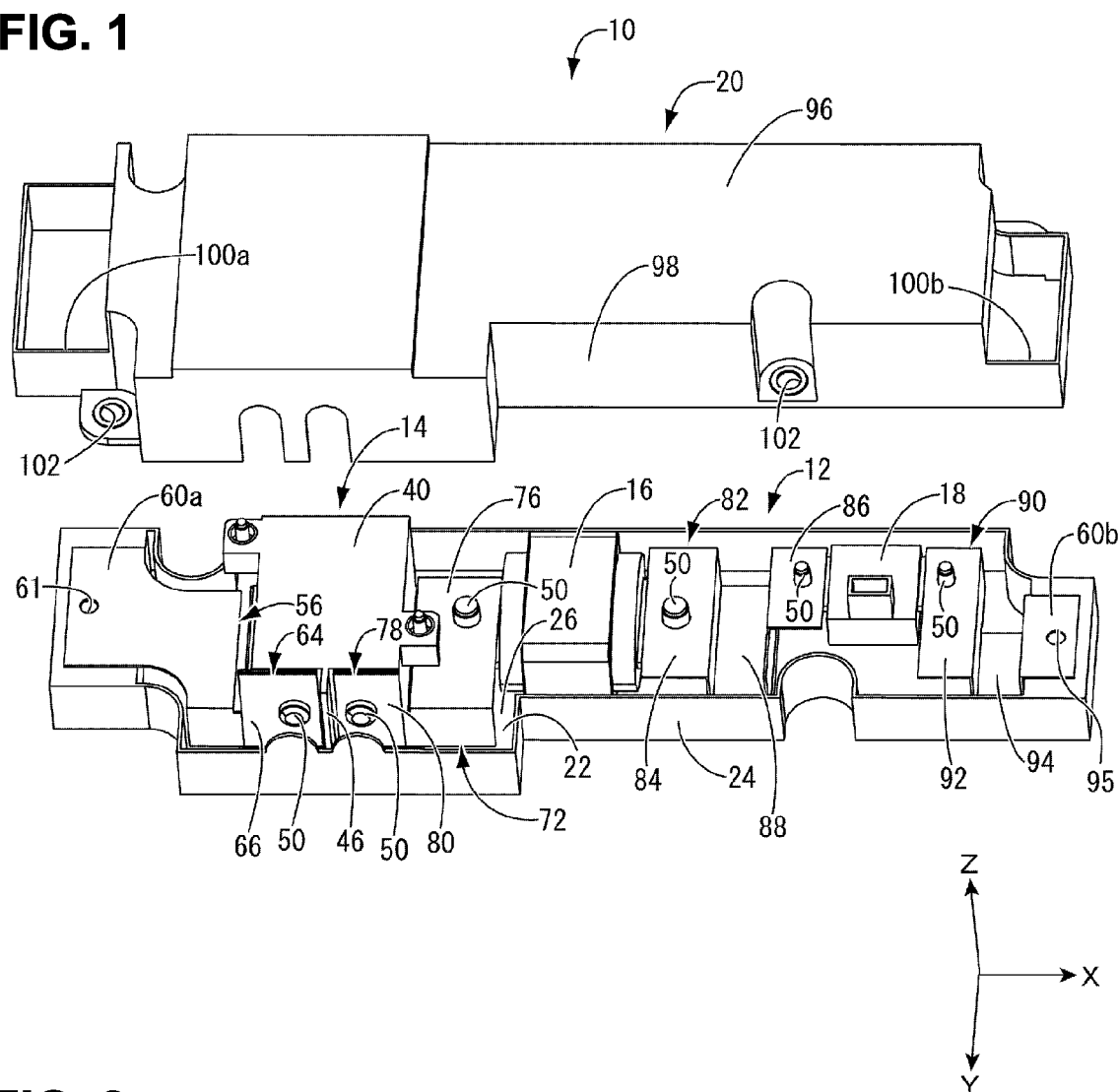
FIG. 1 is an exploded perspective view describing a representative example of a configuration of a circuit structure according to embodiment 1.
Figure 2:
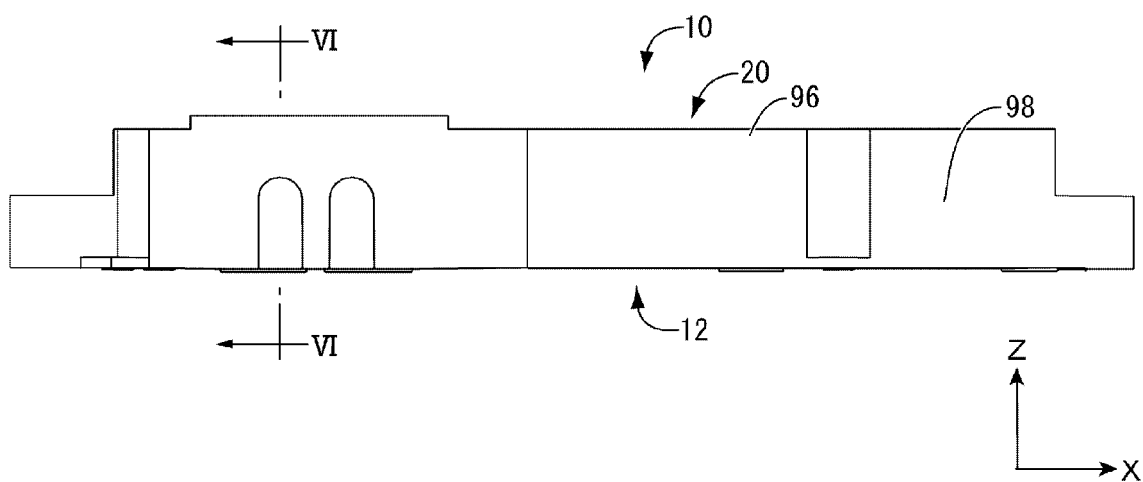
FIG. 2 is a front view of the circuit structure illustrated in FIG. 1 in an assembled state.

First, aspects of the present disclosure will be listed and described.

A circuit structure according to the present disclosure is (1) a circuit structure including: a heat-generating component that generates heat when energized; an energization bus bar that is connected to a connection portion of the heat-generating component; a cooling member that is formed separately from the energization bus bar, and is connected to the connection portion of the heat-generating component along with the energization bus bar; and a heat transfer portion that is provided in the cooling member, and is in heat-conductive contact with a heat-dissipating body.

In the circuit structure according to the present disclosure, members that are connected to a connection portion of a heat-generating component are separated into an energization bus bar and a cooling member, and a heat transfer portion that is provided in the cooling member is in heat-conductive contact with a heat-dissipating body. Therefore, there is no need to form an energization bus bar extending over a long distance so as to be thick over the entire length thereof in order to increase the thermal capacity, compared with a conventional structure in which a heat transfer portion is provided in an energization bus bar, and it is possible to reduce the thickness of the energization bus bar and to thereby reduce the cost. In addition, it is sufficient for the heat transfer portion to be provided in the cooling member, and thus, it is possible to provide the cooling member and the heat transfer portion with a very high degree of freedom of design compared with a case where a heat transfer portion is provided in an energization bus bar that is subjected to various restraints in terms of a circuit configuration and the like. Thus, the heat transfer portion of the cooling member need not be provided so as to extend over a long distance from the connection portion of the heat-generating component as in a conventional structure, the heat transfer portion can be disposed efficiently in a space in the vicinity of the connection portion, and it is also possible to decrease the size and cost of the circuit structure.

Moreover, the energization bus bar and the cooling member are superposed and connected to the connection portion of the heat-generating component, and thus it is possible to increase the thermal capacity of the connection portion of the heat-generating component. As a result, it is possible to sufficiently resist heat generated by a sudden large current. Furthermore, since the energization bus bar and the cooling member that includes the heat transfer portion are separately formed, it is possible to provide the heat transfer portion in a simpler shape, and it is also possible to form the energization bus bar and the cooling member at a high yield rate.

Note that heat-generating components include components that generate heat when energized, such as a relay, a fuse, and a current sensor. As the structure for connecting the energization bus bar to the connection portion of the heat-generating component, any connection structure, such as a bolted structure, may be adopted.

(2) Preferably, at the connection portion of the heat-generating component, the energization bus bar is disposed on the connection portion side relative to the cooling member.

Since, at the connection portion of the heat-generating component, the energization bus bar is disposed on the connection portion side relative to the cooling member, the energization bus bar can be connected to the heat-generating component at low resistance, and it is possible to avoid a loss and realize a circuit structure that generates less heat.

(3) Preferably, a direction in which the energization bus bar extends from the connection portion of the heat-generating component and a direction in which the cooling member extends from the connection portion of the heat-generating component are different.

Members that are connected to the connection portion of the heat-generating component are separated into the energization bus bar and the cooling member, and thus the individual members can be extended in optimum directions. Components can be linked in the shortest distance such that the energization bus bar has low resistance, and the cooling member can be connected to the heat-dissipating body in the shortest distance, for example.

(4) Preferably, a case that houses the energization bus bar, the cooling member, and the heat-generating component is included, and the cooling member is in heat-conductive contact with the heat-generating component, at the connection portion, and the heat transfer portion is in heat-conductive contact with the case, which is the heat-dissipating body.

When the case that houses the energization bus bar, the cooling member, and the heat-generating component is used as the heat-dissipating body, it is possible to more advantageously realize the transfer of heat to the outside via a contact part of the case, by the heat transfer portion coming into heat-conductive contact with the case, which is a heat-dissipating body. Thus, heat from the heat-generating component can be dissipated more favorably in a case such as where the case is installed to a heat-dissipating body having higher heat dissipation performance than the case does.

(5) In (4) above, preferably, a first heat-conducting member that is interposed between contact surfaces of the heat transfer portion and the case is included, and the first heat-conducting member is positioned relative to the contact part of the case that comes into contact with the heat transfer portion. This is preferable because the transfer of heat from the heat transfer portion of the cooling member to the case can be promoted. Moreover, since the first heat-conducting member is positioned relative to the contact part of the case that comes in contact with the heat transfer portion, the transfer of heat in the heat transfer portion can be promoted even more stably.

(6) In (4) or (5) above, preferably, the contact part of the case that comes into contact with the heat transfer portion is in heat-conductive contact with another member that is the heat-dissipating body on an outer surface side of the case, a second heat-conducting member that is interposed between contact surfaces of the other member and the outer surface side of the case is included, and the second heat-conducting member is positioned relative to the contact part on the outer surface side of the case. This is preferable because the dissipation of heat from the heat-generating component to the other member via the heat transfer portion of the cooling member can be promoted even more favorably.

Note that the positioning of the second heat-conducting member relative to the contact part on the outer surface side of the case may be realized by a protrusion, a level difference, or the like provided in the case or may be realized by a protrusion, a recess, or the like provided in another member that is fixedly placed on the case.

(7) Preferably, the energization bus bar and the cooling member are made of different materials.

It is possible to optimize the individual materials of the energization bus bar and the cooling member, and thus it is possible to realize both an energization bus bar that has a smaller loss and generates less heat, and a cooling member that has higher heat dissipation efficiency.

(8) Preferably, the heat transfer portion of the cooling member is in heat-conductive contact with the heat-generating component.

Thus, the heat transfer portion of the cooling member can be brought into direct contact with the heat-generating component, which is a heat source, and the heat transfer portion can be brought into heat-conductive contact with the heat-dissipating body at a position closest to the heat-generating component. Consequently, heat from the heat-generating component can be dissipated more efficiently compared to a conventional structure in which a bus bar is extended in a direction away from a heat-generating component and brought into contact with a heat-dissipating body.

(9) In (8) above, preferably, the cooling member includes a bolt fastening portion that is bolted to the connection portion, and a bolt insertion hole provided in the bolt fastening portion includes a tolerance-absorbing space that absorbs the tolerance of the heat-generating component and allows the heat transfer portion to come into contact with the heat-generating component.

Since the bolt insertion hole in the cooling member includes a tolerance-absorbing space that absorbs the tolerance of the heat-generating component, a difference in the state of contact of the heat transfer portion of the cooling member with the heat-generating component occurring due to the tolerance of the heat-generating component can be reduced. Consequently, the heat transfer portion can be reliably brought into contact with the heat-generating component, and heat from the heat-generating component can be dissipated stably.

(10) In any of (4) to (6) above, preferably, the contact part of the case that comes into contact with the heat transfer portion is thinner than the vicinity of the contact part in the case. By forming the contact part of the case that comes in contact with the heat transfer portion so as to be thinner than the vicinity thereof in the case, heat can be transferred to the outside via the contact part of the case more favorably. Thus, heat from the heat-generating component can be dissipated more favorably in a case such as where the case is installed to a heat-dissipating body having higher heat dissipation performance than the case does.

(11) In (5) above, preferably, the contact part of the case that comes into contact with the heat transfer portion is thinner than the vicinity of the contact part in the case, and the first heat-conducting member is positioned relative to the contact part by a level difference that is formed at a boundary between the contact part and the vicinity. The level difference formed at the boundary between the contact part and the vicinity thereof due to the contact part being thin can be used to position the first heat-conducting member. Thus, efficient dissipation of heat from the heat-generating component can be realized stably with few components.

(12) In (6) above, preferably, the contact part of the case that comes into contact with the heat transfer portion is thinner than the vicinity of the contact part in the case, and the second heat-conducting member is positioned relative to the contact part by a level difference that is formed at a boundary between the contact part and the vicinity. The level difference formed at the boundary between the contact part and the vicinity thereof due to the contact part being thin can be used to position the second heat-conducting member. Thus, efficient dissipation of heat from the heat-generating component can be realized stably with few components. In particular, heat can be dissipated even more efficiently and stability can be ensured by adopting this configuration in combination with (11).

(13) In (1) above, preferably, a case that houses the energization bus bar, the cooling member, and the heat-generating component, and a first heat-conducting member that is interposed between contact surfaces of the heat transfer portion and the case are further included, a pair of connection portions are provided in the heat-generating component, the energization bus bar and the cooling member formed separately from each other are connected to one of the connection portions, the energization bus bar that includes a heat-dissipating portion is connected to the other connection portion, and the heat transfer portion is extended toward the energization bus bar that includes the heat-dissipating portion and the heat transfer portion and the heat-dissipating portion are in heat-conductive contact with the case via the one first heat-conducting member.

The heat transfer portion is extended toward the energization bus bar that includes a heat-dissipating portion, and the heat transfer portion and the heat-dissipating portion are in heat-conductive contact with the case via the one first heat-conducting member. Thus, compared with a case in which first heat-conducting members are separately provided for the heat transfer portion and the heat-dissipating portion, it is also possible to particularly keep the width of the first heat-conducting member small, and also to reduce the total area of the first heat-conducting member. In addition, compared with a case in which first heat-conducting members are provided separately for the heat transfer portion and the heat-dissipating portion, it is also possible to reduce the number of assembly processes.

(14) In (13) above, preferably, the energization bus bar connected to the other connection portion is routed between the heat-generating component and the first heat-conducting member.

By routing the energization bus bar between the heat-generating component and the first heat-conducting member, a portion of the energization bus bar that is located between the heat-generating component and the first heat-conducting member can serve as the heat-dissipating portion. Particularly, by bringing the heat-generating component into direct contact with the heat-dissipating portion, it is possible to more efficiently and promptly achieve the transfer of heat from the heat-generating component to the case through the heat-dissipating portion and the first heat-conducting member.

(15) In (13) or (14) above, preferably, a plurality of heat-generating components are included, a plurality of energization bus bars that each include the heat-dissipating portion are thermally connected to the plurality of heat-generating components, and the heat transfer portion and the plurality of heat-dissipating portions are in heat-conductive contact with the case via the one first heat-conducting member.

The heat transfer portion and the plurality of heat-dissipating portions are in heat-conductive contact with the case via the one first heat-conducting member, and thus, compared with a case in which first heat-conducting members are provided separately for the heat transfer portion and a plurality of heat-dissipating portions, it is possible to reduce the number of assembly processes.

DETAILS OF EMBODIMENTS OF PRESENT DISCLOSURE

Specific examples of the circuit structure according to the present disclosure will be described with reference to the drawings below. Note that the present disclosure is not limited to these examples, and is intended to include all modifications that are indicated by the claims and are within the meaning and scope of equivalents of the claims.

Embodiment 1

Embodiment 1, in which the technique disclosed in the present description is applied to a circuit structure 10, will be described with reference to FIGS. 1 to 6. The circuit structure 10 is installed in a vehicle (not shown) such as an electric automobile or a hybrid automobile, for example, and supplies and controls electric power from a power source (not shown) such as a battery to a load (not shown) such as a motor. While the circuit structure 10 can be oriented in any direction, in the following description, the Z direction is regarded as the upward direction, the Y direction is regarded as the forward direction, and the X direction is regarded as the rightward direction. Furthermore, when more than one of the same member is provided, the reference numeral therefor may be provided to only some of the members and may be omitted for the rest.

As illustrated in FIG. 1, the circuit structure 10 includes a base member 12 that constitutes a case, electric components disposed in the base member 12, such as a relay 14 (one example of a heat-generating component), a fuse 16 (one example of a heat-generating component), and a current sensor 18 (one example of a heat-generating component), and a lid member 20 that covers the base member 12 from above and constitutes the case.

Base Member 12

Figure 3:
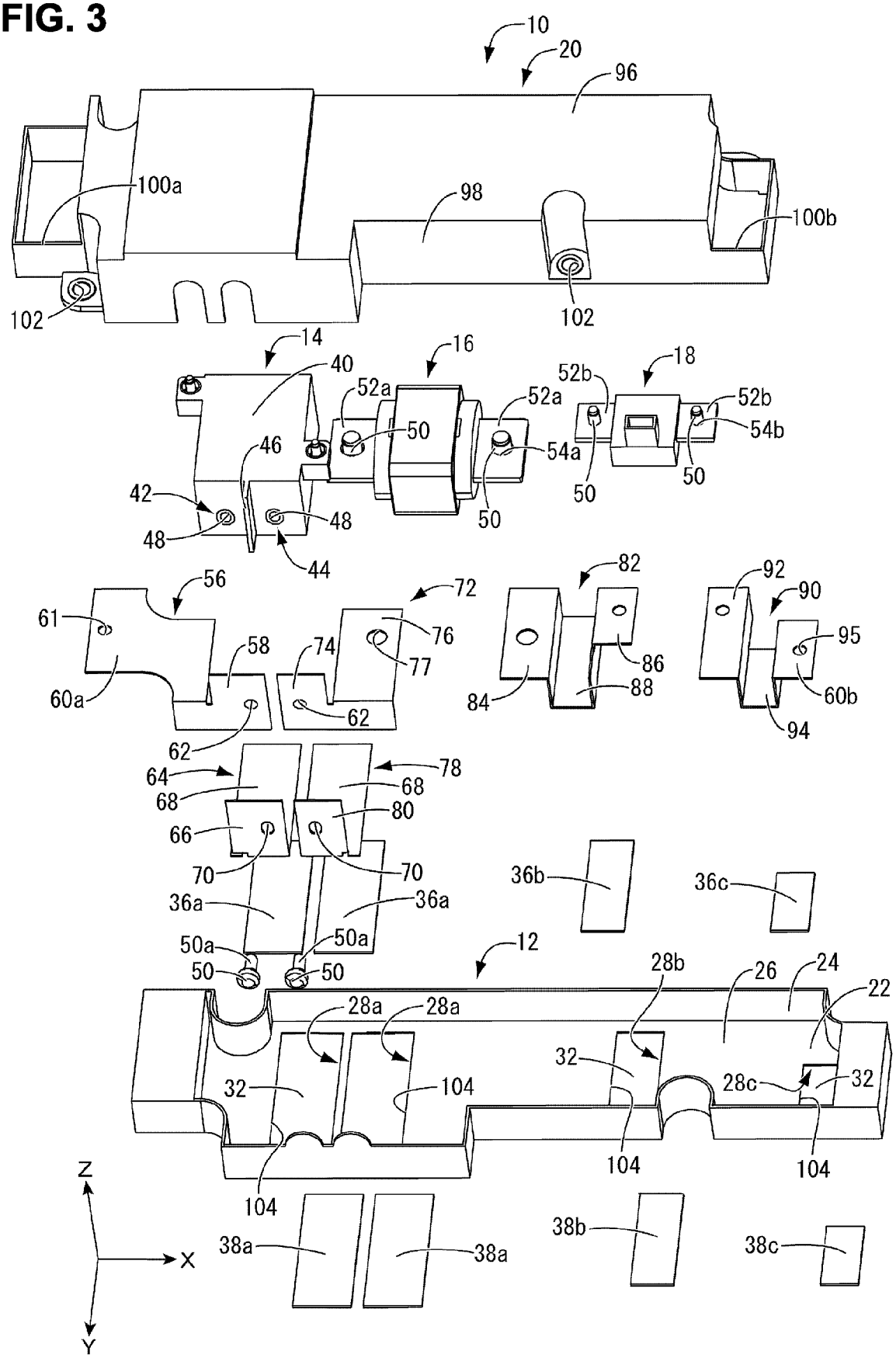
FIG. 3 is an exploded perspective view in which the circuit structure illustrated in FIG. 1 is broken up further into individual constituent components.

The base member 12 is obtained by injection molding an insulative synthetic resin into a predetermined shape. The synthetic resin forming the base member 12 may contain a filler such as glass fibers. As illustrated in FIG. 3 for example, the base member 12 has a substantially rectangular box shape as a whole that is open upward, and includes a bottom wall 22 and a peripheral wall 24 that stands upright from the end edge portion of the bottom wall 22. In embodiment 1 of the present disclosure, the base member 12 has a substantially rectangular outer shape when seen from above. Note that the outer shape of the base member 12 is not limited to that in the present embodiment.

As illustrated in FIG. 3, in the left end portion of an upper surface 26 of the bottom wall 22 of the base member 12, two first-heat-conducting-member-housing portions 28a that have a recessed shape, have a rectangular shape in a plan view, and are open upward are disposed adjacent to one another in the left-right direction and disposed side by side across a slight gap. Also, in the center portion of the upper surface 26, a first-heat-conducting-member-housing portion 28b that is provided with a smaller area than the first-heat-conducting-member-housing portions 28a, has a recessed shape, and has a rectangular shape in a plan view is formed open upward. Furthermore, in the right end portion of the upper surface 26, a rectangular first-heat-conducting-member-housing portion 28c that is provided with a smaller area than the first-heat-conducting-member-housing portion 28b, has a recessed shape, and has a rectangular shape in a plan view is formed open upward.

Figure 4:
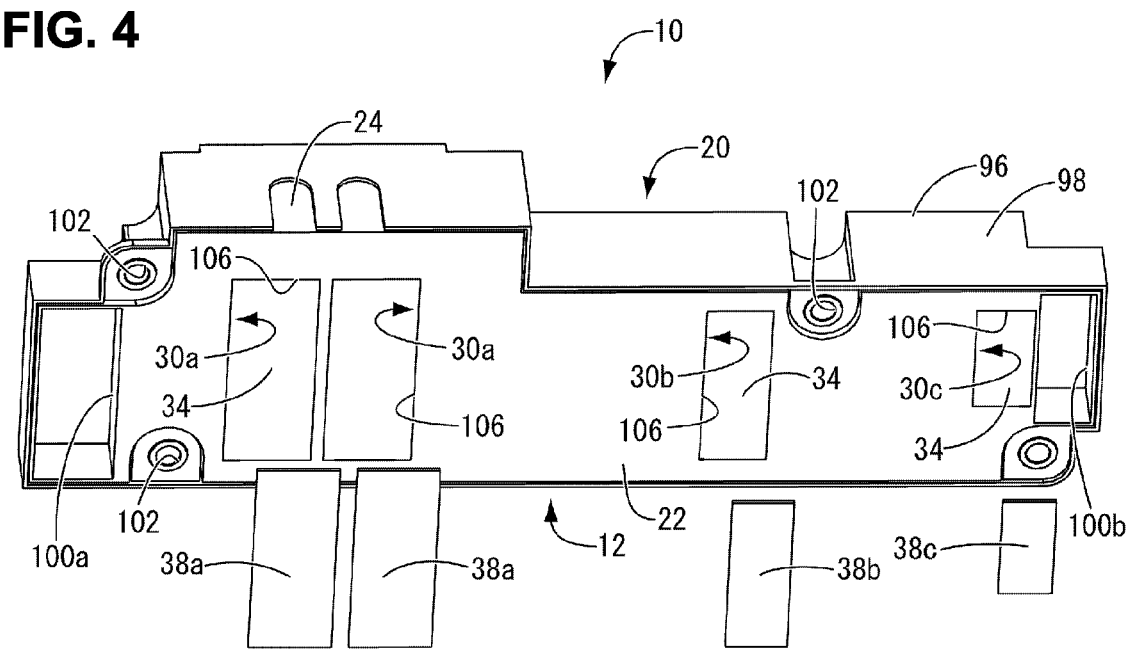
FIG. 4 is a perspective view in which the circuit structure in the assembled state illustrated in FIG. 2 is viewed from below, and is an exploded view in which only second heat-conducting members are separated.
Figure 4:
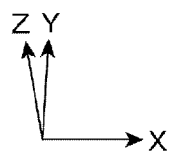
Figure 6:
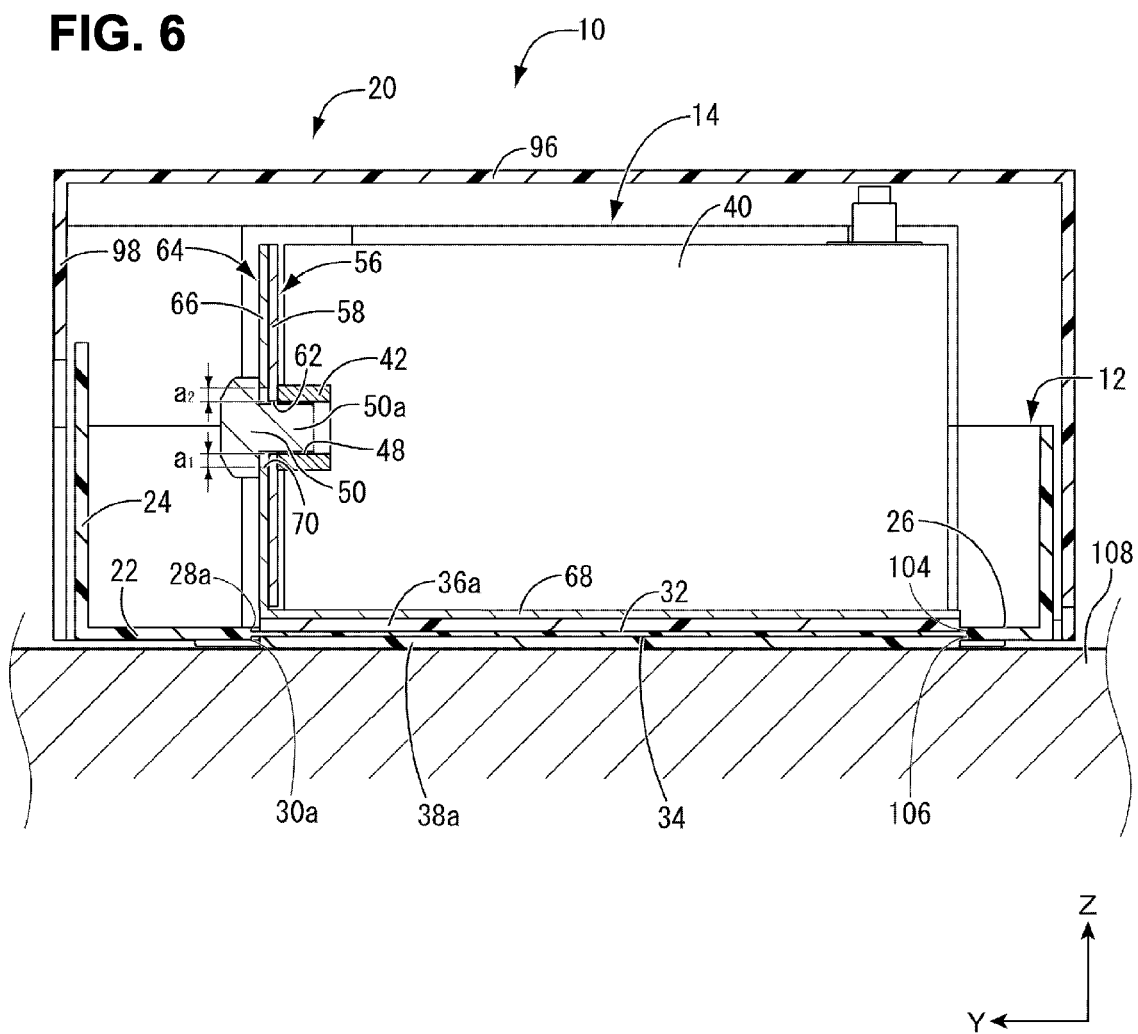
FIG. 6 is an enlarged view of a cross-section taken along line VI-VI in FIG. 2.
Figure 7:
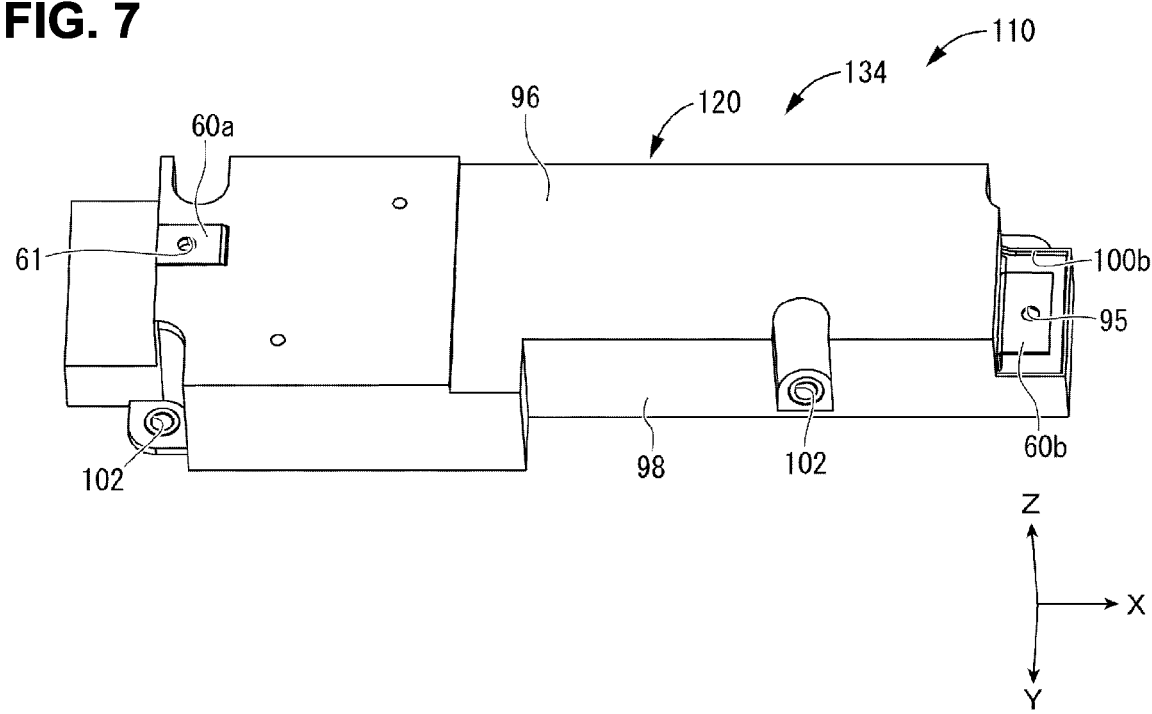
FIG. 7 is a perspective view of a circuit structure according to embodiment 2 in an assembled state.
Figure 8:
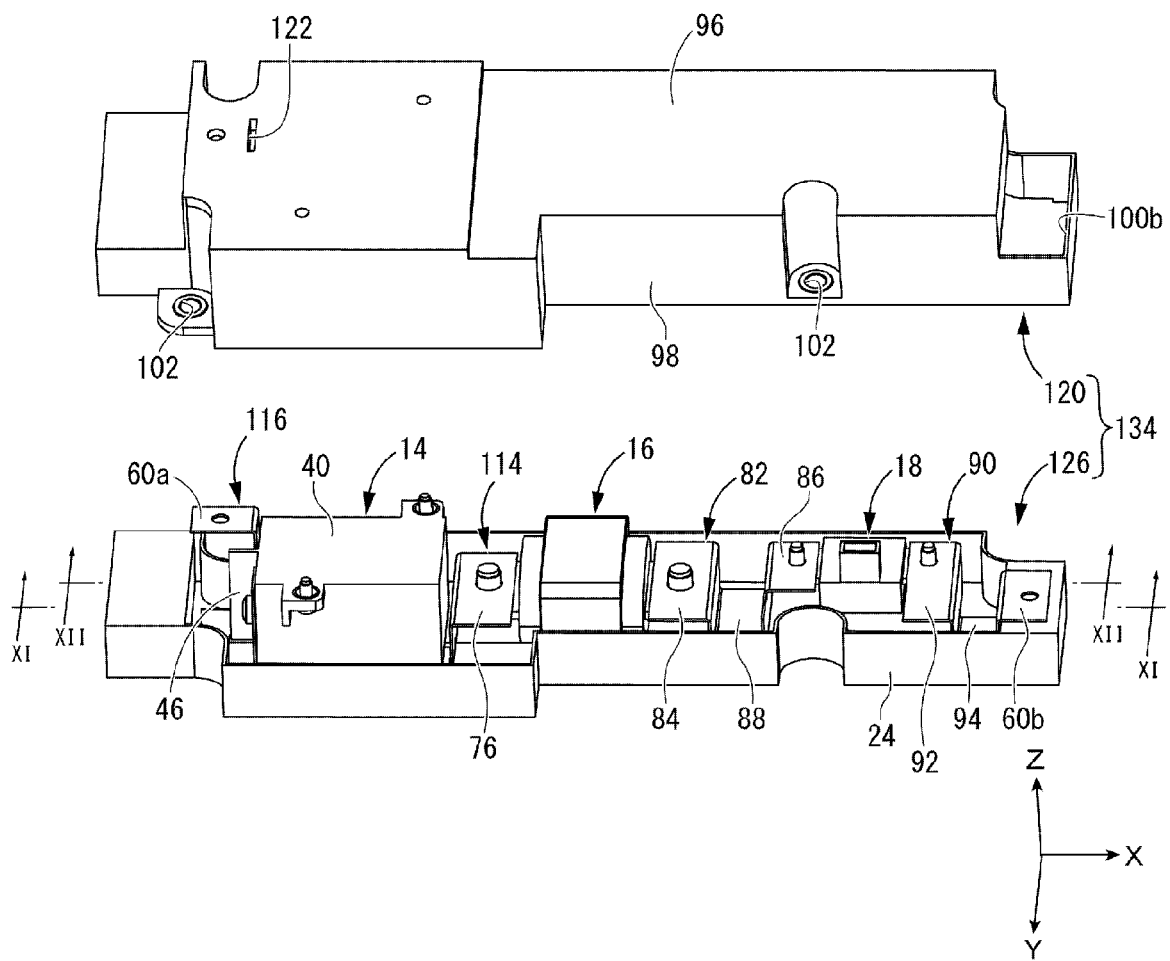
FIG. 8 is an exploded perspective view illustrating a state where a lid member constituting a case is detached from the circuit structure illustrated in FIG. 7.
Figure 9:
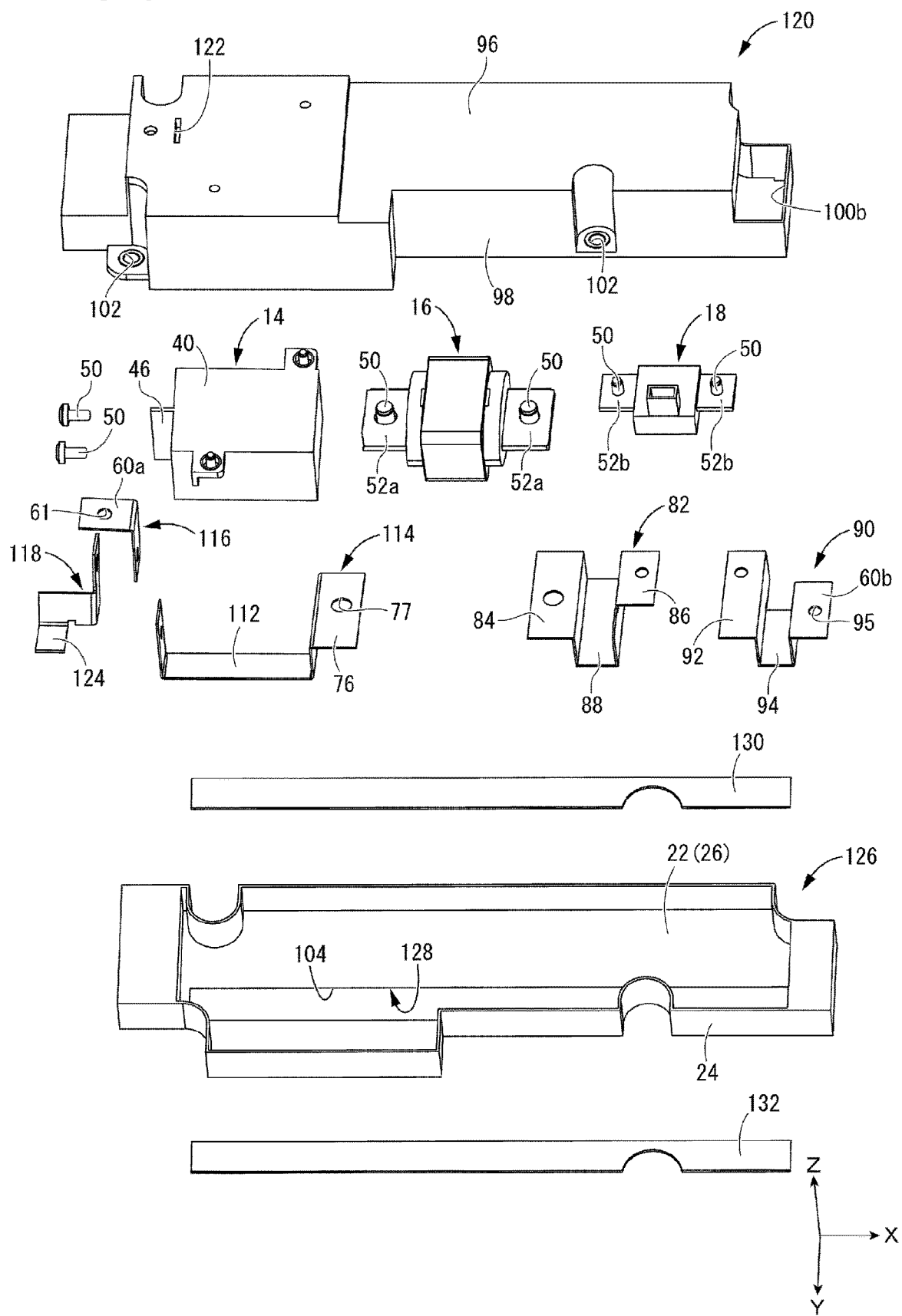
FIG. 9 is an exploded perspective view in which the circuit structure illustrated in FIG. 7 is broken up into individual constituent components.
Figure 10:
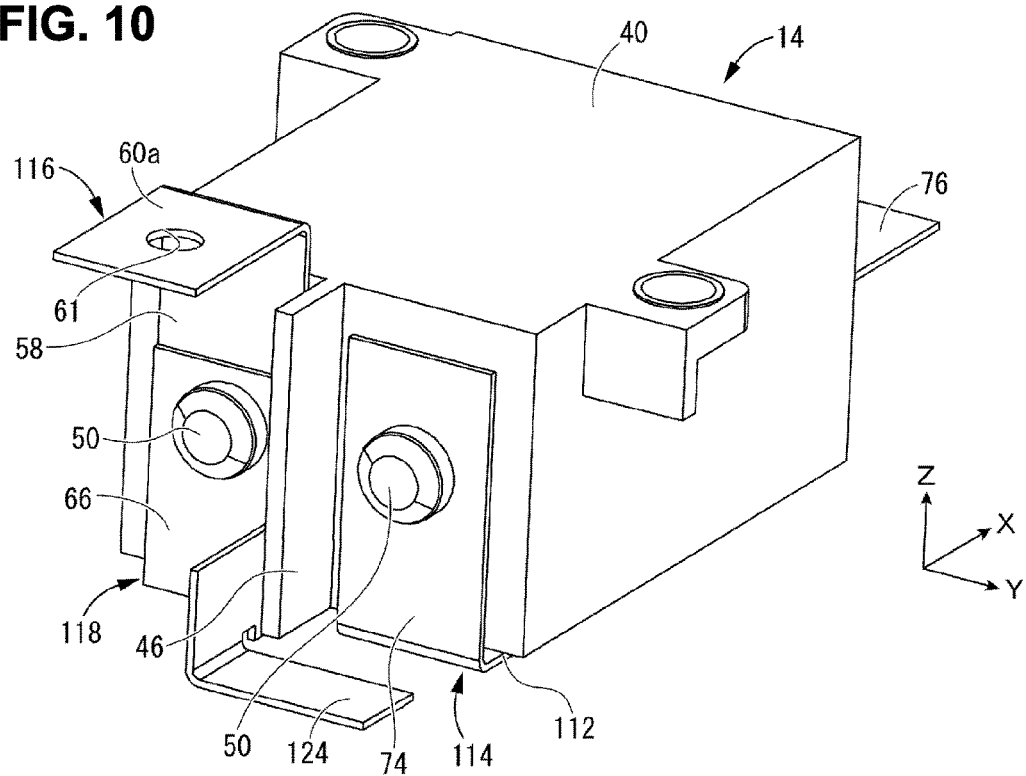
FIG. 10 is a perspective view illustrating representative constituent components relating to the relay illustrated in FIG. 9, in a state of being attached to the relay.

In addition, as illustrated in FIG. 4, on the reverse side of the first-heat-conducting-member-housing portions 28a in the bottom wall 22 of the base member 12, second-heat-conducting-member-housing portions 30a that have a recessed shape and that have a rectangular shape in a rear view are formed open downward at the same positions as the first-heat-conducting-member-housing portions 28a in the top-bottom direction. Similarly, second-heat-conducting-member-housing portions 30b, 30c that have a recessed shape and that have a rectangular shape in a rear view are formed open downward at the same positions as the first-heat-conducting-member housing portions 28b, 28c in the top-bottom direction on the reverse side of the first-heat-conducting-member-housing portions 28b, 28c. As illustrated in FIG. 6, in the bottom wall 22 of the base member 12, parts forming bottom surfaces 32, 34 of the recessed first-heat-conducting-member-housing portions 28a, 28b, 28c and the recessed second-heat-conducting-member-housing portions 30a, 30b, 30c are formed thinner than the vicinity thereof.

First Heat-Conducting Members 36a, 36b, 36c and Second Heat-Conducting Members 38a, 38b, 38c As illustrated in FIGS. 3 and 6, first heat-conducting members 36a are housed in the first-heat-conducting-member-housing portions 28a, and second heat-conducting members 38a are housed in the second-heat-conducting-member-housing portions 30a. Similarly, first heat-conducting members 36b, 36c are housed in the first-heat-conducting-member-housing portions 28b, 28c, and second heat-conducting members 38b, 38c are housed in the second-heat-conducting-member-housing portions 30b, 30c.

Each of the first heat-conducting members 36a, 36b, 36c and the second heat-conducting members 38a, 38b, 38c is insulative, is formed in the shape of a sheet that is flat in the top-bottom direction, and is made of a synthetic resin that has higher heat conductivity than air. Specifically, a silicone resin, a non-silicone acrylic or ceramic resin, or the like can be used. More specifically, examples include heat-conductive silicone rubber, heat-conductive grease, heat-dissipating gap fillers, etc., made from silicone resins. The first heat-conducting members 36a, 36b, 36c are flexible, and the thickness thereof can change in response to a force applied thereto in the top-bottom direction. Note that, while each of the first heat-conducting members 36a, 36b, 36c and the second heat-conducting members 38a, 38b, 38c are formed in the shape of a sheet in the present embodiment, there is no limitation to this and any shape may be adopted.

Relay 14

Figure 5:
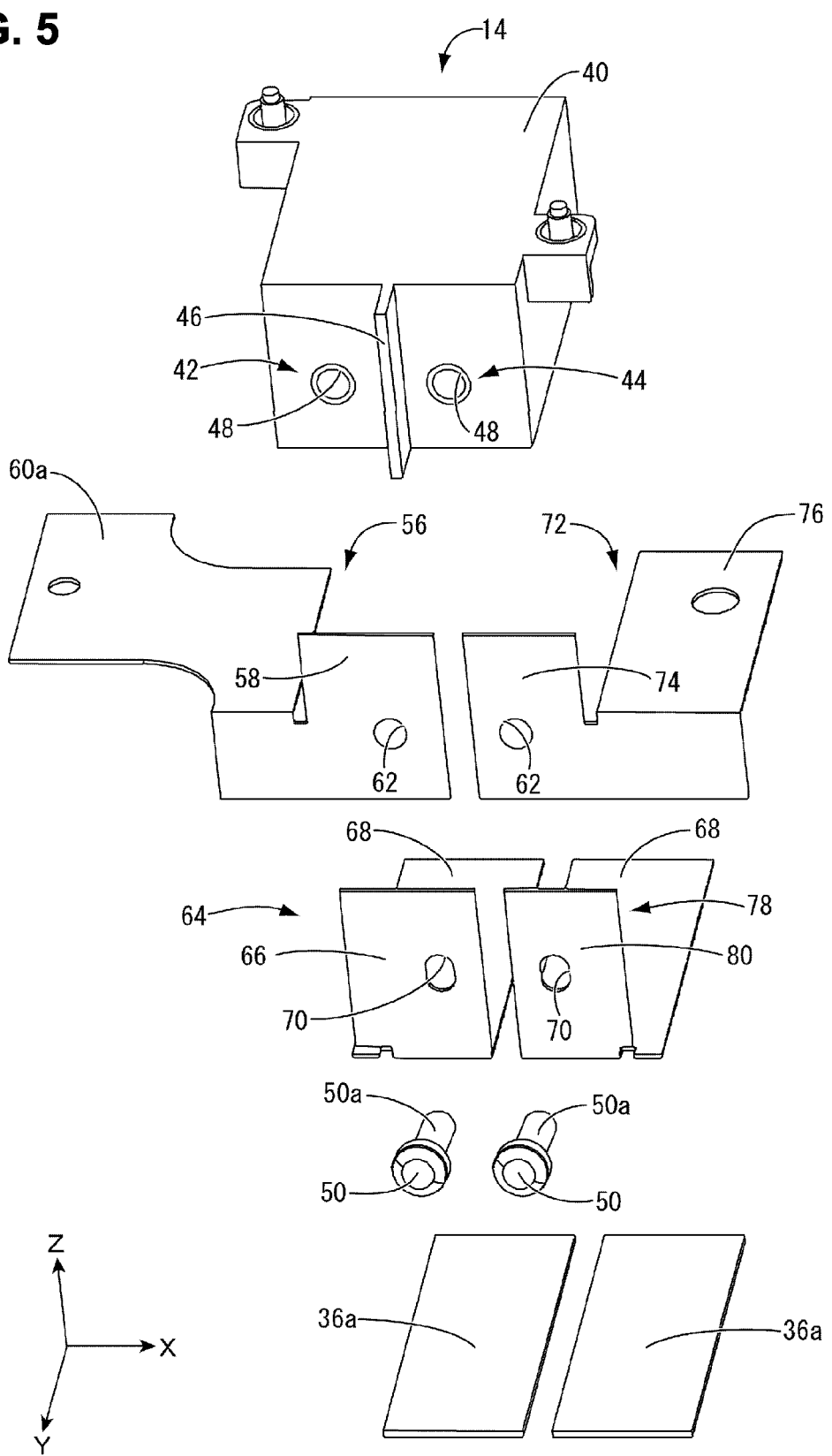
FIG. 5 is an exploded perspective view describing representative constituent components relating to a relay illustrated in FIG. 3.

As illustrated in FIGS. 3 and 5, the relay 14 is a mechanical electric component, so to speak, and includes, inside a rectangular solid-shaped main body 40, an unshown contact portion and coil portion. On the front surface of the main body 40, a first power terminal 42 (one example of a connection portion) that is provided on the left side and a second power terminal 44 (one example of a connection portion) that is provided on the right side are disposed side by side in the left-right direction. When a current flows between the first power terminal 42 and the second power terminal 44, heat is generated by the contact portion and the coil portion. The contact portion is provided on the side (the front side in FIG. 5) close to the first power terminal 42 and the second power terminal 44, and the coil portion is provided on the side (the back side in FIG. 5) distant from the first power terminal 42 and the second power terminal 44. Furthermore, on the front surface of the main body 40, an insulating plate 46 that partitions the first power terminal 42 and the second power terminal 44 from one another is provided between the two terminals 42, 44. Note that, as illustrated in FIG. 6, a bolt hole 48 that extends in the front-rear direction is formed in each of the first power terminal 42 and the second power terminal 44.

A later-described first energization bus bar 56 and first cooling member 64 formed separately from the first energization bus bar 56 are connected to the first power terminal 42 by screwing a bolt 50 into the bolt hole 48, and are brought into heat-conductive contact with the first power terminal 42. Also, a later-described second energization bus bar 72 and second cooling member 78 formed separately from the second energization bus bar 72 are connected to the second power terminal 44 by screwing a bolt 50 into the bolt hole 48, and are brought into heat-conductive contact the second power terminal 44.

Fuse 16

As illustrated in FIG. 3, the fuse 16 is formed in the shape of a rectangular solid. A lead terminal 52a (one example of a connection portion) is formed protruding outward in the left-right direction from each of the left and right side surfaces of the fuse 16. The lead terminals 52a are made from a metal plate. Each lead terminal 52a is provided with an insertion hole 54a that penetrates the lead terminal 52a in the top-bottom direction.

Current Sensor 18

As also illustrated in FIG. 3, the current sensor 18 is formed in the shape of a rectangular solid. A lead terminal 52b (one example of a connection portion) is formed protruding outward in the left-right direction from each of the left and right side surfaces of the current sensor 18. The lead terminals 52b are made from a metal plate. Each lead terminal 52b is provided with an insertion hole 54b that penetrates the lead terminal 52b in the top-bottom direction.

First Energization Bus Bar 56

The first energization bus bar 56, which is an energization bus bar, is obtained by pressing a metal plate into a predetermined shape. As the metal forming the first energization bus bar 56, a metal that has high thermal conductivity and low electrical resistance, such as copper, a copper alloy, aluminum, or an aluminum alloy, can be chosen, as appropriate. As illustrated in FIG. 3, the first energization bus bar 56 extends in the left-right direction, and is formed so as to bend in an L-shape at an appropriate position in the left-right direction. The first energization bus bar 56 includes: a bolt fastening portion 58 provided in the right end portion thereof; and an external connection portion 60a that extends from a bottom end portion of the bolt fastening portion 58 toward the left, is bent in an L shape, spreads out in the horizontal direction (front-rear direction and right-left direction), and is provided in the left end portion of the first energization bus bar 56. A bolt insertion hole 61 is formed in the external connection portion 60a.

The bolt fastening portion 58 has a rectangular shape when seen from the front, and has a bolt insertion hole 62 having a circular shape penetrating therethrough slightly to the right of the center portion thereof. In this manner, one end portion (right end portion) of the first energization bus bar 56 serves as the bolt fastening portion 58, which is a connection part that is connected to the first power terminal 42, which is a connection portion of the relay 14, which is a heat-generating component.

First Cooling Member 64

The first cooling member 64, which is a cooling member, is constituted by a flat metal plate member obtained by pressing a plate made of any metal described in connection with the first energization bus bar 56 into a predetermined shape. As illustrated in FIG. 3, the first cooling member 64 extends in the front-rear direction, and is formed so as to bend in an L shape at an appropriate position in the front-rear direction. The first cooling member 64 includes a bolt fastening portion 66 provided in the front end portion thereof and a heat-transfer portion 68 provided so as to bend in an L shape in the bottom end portion of the bolt fastening portion 66 and extend toward the rear. Note that, if the heat conductivity of the first cooling member 64 (a second cooling member 78 to be described later) is high, the electrical resistance does not necessarily need to be low, and thus it is possible to use a material different from that of the first energization bus bar 56 (second to fourth energization bus bars 72, 82, 90 to be described later).

The bolt fastening portion 66 has a rectangular shape when seen from the front, and has a bolt insertion hole 70 having a vertically elongated elliptic shape penetrating therethrough slightly to the right of the center portion thereof. In this manner, one end portion (front end portion) of the first cooling member 64 serves as the bolt fastening portion 66, which is a connection part that is connected to the first power terminal 42, which is a connection portion of the relay 14, which is a heat-generating component.

The bolt fastening portion 58 and the bolt fastening portion 66 are bolted to the first power terminal 42 as a result of a screw portion 50a of the bolt 50 being inserted through the bolt insertion holes 70, 62 and being screwed into the bolt hole 48 of the first power terminal 42 in a state in which the bolt fastening portion 58 and the bolt fastening portion 66 are superposed on the first power terminal 42 from the front. Thus, the first energization bus bar 56 and the first cooling member 64 are electrically connected to the relay 14. As a result, at the first power terminal 42, the bolt fastening portion 58 is disposed on the first power terminal 42 side relative to the bolt fastening portion 66.

In addition, as illustrated in FIG. 5, since the bolt insertion hole 70 provided in the bolt fastening portion 66 has a vertically elongated elliptical shape, a top-bottom direction tolerance of the relay 14 relative to the bolt fastening portion 66 can be absorbed. That is, as illustrated in FIG. 6, the bolt insertion hole 70 of the bolt fastening portion 66 has tolerance-absorbing spaces ($a_1$ and $a_2$ in FIG. 6) above and below the bolt hole 48 of the first power terminal 42. Thus, the heat transfer portion 68 extending from the bottom end portion of the bolt fastening portion 66 can reliably come into contact with the bottom surface of the main body 40 of the relay 14. In this manner, according to the present embodiment, the heat-transfer portion 68 provided in the first cooling member 64 is brought into direct contact with the relay 14, which is a heat-generating component, and the heat-transfer portion 68 is in heat-conductive contact with the base member 12, which is a heat-dissipating body, at a position closest to the relay 14.

Furthermore, when a bolt is inserted into the bolt insertion hole 61 and is fastened in a state in which an unshown external circuit terminal is superposed on the external connection portion 60a, the external connection portion 60a and the external circuit terminal are electrically connected.

Second Energization Bus Bar 72

The second energization bus bar 72, which is an energization bus bar, is obtained by pressing a plate made from a desired metal, examples of which have been described in connection with the first energization bus bar 56, into a predetermined shape. As illustrated in FIG. 3, the second energization bus bar 72 extends in the left-right direction, and is formed so as to bend in an L shape at an appropriate position in the left-right direction. The second energization bus bar 72 includes: a bolt fastening portion 74 that is provided in the left end portion thereof; and a fuse connection portion 76 that extends to the right from the bottom end portion of the bolt fastening portion 74, bends in an L shape, extends in the front-rear direction, and is provided in the rear end portion of the second energization bus bar 72. A bolt insertion hole 77 into which the bolt 50 is inserted when the circuit structure 10 is being assembled is formed in the fuse connection portion 76.

The bolt fastening portion 74 has a rectangular shape when seen from the front, and has the bolt insertion hole 62 having a circular shape penetrating therethrough slightly to the left of the central portion thereof. In this manner, one end portion (left end portion) of the second energization bus bar 72 serves as the bolt fastening portion 74, which is a connection part that is connected to the second power terminal 44, which is a connection portion of the relay 14, which is a heat-generating component.

Second Cooling Member 78

The second cooling member 78, which is a cooling member, is constituted by a flat metal plate member obtained by pressing a plate made of any metal described in connection with the first energization bus bar 56 into a predetermined shape. As illustrated in FIG. 3, the second cooling member 78 extends in the front-rear direction, and is formed so as to bend in an L shape at an appropriate position in the front-rear direction. The second cooling member 78 includes: a bolt fastening portion 80 provided in the front end portion thereof; and the heat-transfer portion 68 that is provided so as to bend in an L shape in the bottom end portion of the bolt fastening portion 80 and extend to the rear.

The bolt fastening portion 80 has a rectangular shape when seen from the front, and has the bolt insertion hole 70 having a vertically elongated elliptic shape penetrating therethrough slightly to the left of the center portion thereto. In this manner, one end portion (front end portion) of the second cooling member 78 serves as the bolt fastening portion 80, which is a connection part that is connected to the second power terminal 44, which is a connection portion of the relay 14, which is a heat-generating component.

When the screw portion 50a of the bolt 50 is inserted through the bolt insertion holes 70, 62 and is screwed into the bolt hole 48 of the second power terminal 44 in a state in which the bolt fastening portion 74 and the bolt fastening portion 80 are superposed on the second power terminal 44 from the front, the bolt fastening portion 74 and the bolt fastening portion 80 are bolted to the second power terminal 44. Thus, the second energization bus bar 72 and the second cooling member 78 are electrically connected to the relay 14. Note that, at the second power terminal 44, the bolt fastening portion 74 is disposed on the second power terminal 44 side relative to the bolt fastening portion 80.

In addition, since the bolt insertion hole 70 provided in the bolt fastening portion 80 has a vertically elongated elliptic shape as illustrated in FIG. 5, a top-bottom direction tolerance of the relay 14 relative to the bolt fastening portion 80 can be absorbed. Specifically, similarly to the bolt fastening portion 66 illustrated in FIG. 6, the bolt insertion hole 70 of the bolt fastening portion 80 has tolerance-absorbing spaces ($a_1$ and $a_2$ in FIG. 6) on the upper and lower side of the bolt hole 48 of the second power terminal 44. Thus, the heat-transfer portion 68 extending from the bottom end portion of the bolt fastening portion 80 can reliably come into contact with the bottom surface of the main body 40 of the relay 14. Similarly to the first cooling member 64, according to the present embodiment, the heat-transfer portion 68 provided in the second cooling member 78 is brought into direct contact with the relay 14, which is a heat-generating component, and the heat-transfer portion 68 is brought into heat-conductive contact with the base member 12, which is a heat-dissipating body, at a position closest to the relay 14.

The fuse connection portion 76 has a rectangular shape when seen from above. The fuse connection portion 76 is fixed to the lead terminal 52a that protrudes toward the left from the fuse 16 by a bolt 50 in a state in which the fuse connection portion 76 is superposed on the lead terminal 52a. Thus, the second energization bus bar 72 and the fuse 16 are electrically connected.

Third Energization Bus Bar 82

As illustrated in FIG. 3, a third energization bus bar 82 (an example of energization bus bar) extends in the left-right direction, and is formed so as to bend in a crank shape at an appropriate position in the left-right direction. The third energization bus bar 82 includes a fuse connection portion 84 that is provided in the left end portion, a current sensor connection portion 86 that is provided in the right end portion, and a U-shaped portion that connects the fuse connection portion 84 and the current sensor connection portion 86 in a U shape. A heat-dissipating portion 88 is formed by the bottom wall of the U-shaped portion. The third energization bus bar 82 is also made of a desired metal having high thermal conductivity and low electric resistance, examples of which have been described in connection with the first energization bus bar 56.

The fuse connection portion 84 is fixed to a lead terminal 52a that protrudes toward the right from the fuse 16 by screwing a bolt 50 in a state in which the fuse connection portion 84 is superposed on the lead terminal 52a. Thus, the third energization bus bar 82 and the fuse 16 are electrically connected.

The current sensor connection portion 86 is fixed to a lead terminal 52b that protrudes toward the left from the current sensor 18 by screwing a bolt 50 in a state in which the current sensor connection portion 86 is superposed on the lead terminal 52b. Thus, the third energization bus bar 82 and the current sensor 18 are electrically connected.

Fourth Energization Bus Bar 90

As illustrated in FIG. 3, a fourth energization bus bar 90 (an example of an energization bus bar) extends in the left-right direction, and is formed so as to bend in a crank shape at an appropriate position in the left-right direction. The fourth energization bus bar 90 includes a current sensor connection portion 92 that is provided in the left end portion, an external connection portion 60b that is provided in the right end portion, and a U-shaped portion that connects the current sensor connection portion 92 and the external connection portion 60b in a U shape. A heat-dissipating portion 94 is formed by the bottom wall of the U-shaped portion. The fourth energization bus bar 90 is also made of a desired metal having high thermal conductivity and low electric resistance, examples of which have been described in connection with the first energization bus bar 56.

The current sensor connection portion 92 is fixed to the lead terminal 52b that protrudes toward the right from the current sensor 18 by screwing a bolt 50 in a state in which the current sensor connection portion 92 is superposed on the lead terminal 52b. Thus, the fourth energization bus bar 90 and the current sensor 18 are electrically connected.

Furthermore, a bolt insertion hole 95 is formed in the external connection portion 60b. When a bolt is inserted into the bolt insertion hole 95 and is fastened in a state in which an unshown external circuit terminal is superposed on the external connection portion 60b, the external connection portion 60b and the external circuit terminal are electrically connected.

Lid Member 20

The lid member 20 is obtained by injection molding a material similar to that of the base member 12 into a predetermined shape. The lid member 20 has the shape of a box that is open downward. In the present embodiment, the lid member 20 has a rectangular shape when seen from above so as to correspond to the base member 12. That is, the lid member 20 includes a rectangular upper bottom-wall portion 96 and a peripheral wall portion 98 that protrudes downward from the periphery of the upper bottom-wall portion 96.

As illustrated in FIGS. 1 and 3, opening portions 100a, 100b open in the top-bottom direction are formed in the left-right direction end portions of the lid member 20 by making rectangular shaped cut-outs in the upper bottom-wall portion 96. In addition, a plurality of bolt insertion holes 102 into which bolts are inserted when another 108 is being mounted (see FIG. 6) to be described later are formed in the outer periphery portion of the cover member 20.

Assembly Process of Circuit Structure 10

Next, one example of an assembly process of the circuit structure 10 will be described. The assembly process of the circuit structure 10 is not limited by the following description.

First, the base member 12 is prepared. Next, two first heat-conducting members 36a, one each of first heat-conducting members 36b, 36c, two second heat-conducting members 38a, and one each of second heat-conducting members 38b, 38c are cut out into predetermined shapes using a known method such as Thomson punching. The first heat-conducting members 36a, 36b, 36c and the second heat-conducting members 38a, 38b, 38c formed in such a manner are respectively arranged inside the first-heat-conducting-member-housing portions 28a, 28b, 28c and the second-heat-conducting-member-housing portions 30a, 30b, 30c. Here, the first heat-conducting members 36a, 36b, 36c are positioned by the bottom surfaces 32 of the first-heat-conducting-member-housing portions 28a, 28b, 28c, which are the contact parts of the base member 12 that come into contact with the heat transfer portion 68 and the heat-dissipating portions 88, 94, and level differences 104 around the bottom surfaces 32. Furthermore, the second heat-conducting members 38a, 38b, 38c are positioned by the bottom surfaces 34 of the second-heat-conducting-member housing portions 30a, 30b, 30c, which are the contact parts of the base member 12 that come into contact with the other member 108 to be described later that is provided on the outer surface side of the base member 12, and level differences 106 around the bottom surfaces 34.

Subsequently, the first to fourth energization bus bars 56, 72, 82, 90 and first and second cooling members 64, 78 are attached to the relay 14, the fuse 16, and the current sensor 18. For example, first, the bolt insertion hole 62 provided in the bolt fastening portion 58 of the first energization bus bar 56 is superposed on the bolt hole 48 provided in the first power terminal 42 of the relay 14. Next, the bolt insertion hole 70 provided in the bolt fastening portion 66 of the first cooling member 64 is superposed on the bolt insertion hole 62, and the heat transfer portion 68 of the first cooling member 64 is brought into contact with the bottom surface of the relay 14. In this state, the bolt fastening portion 58 of the first energization bus bar 56 and the bolt fastening portion 66 of the first cooling member 64 are bolted to the first power terminal 42 of the relay 14. Similarly, the bolt fastening portion 74 of the second energization bus bar 72 and the bolt fastening portion 80 of the second cooling member 78 are bolted to the second power terminal 44 of the relay 14. Thus, the heat transfer portion 68 of the second cooling member 78 is in contact with the bottom surface of the relay 14. As a result of the above, at the first power terminal 42 which is a connection portion, the first energization bus bar 56, which is an energization bus bar, is fixed in a state of being disposed on the first power terminal 42 (connection portion) side relative to the first cooling member 64, which is a cooling member. Also, at the second power terminal 44, which is a connection portion, the second energization bus bar 72, which is an energization bus bar, is fixed in a state of being disposed on the second power terminal 44 (connection portion) side relative to the second cooling member 78, which is a cooling member.

Next, the lead terminal 52a protruding toward the left from the fuse 16 is superposed on the fuse connection portion 76 of the second energization bus bar 72 from below, and the lead terminal 52a and the fuse connection portion 76 are connected using a bolt 50. With regard to the lead terminal 52a protruding toward the right from the fuse 16, the fuse connection portion 84 of the third energization bus bar 82 is superposed on the lead terminal 52a from above, and the lead terminal 52a and the fuse connection portion 84 are connected using a bolt 50.

With regard to the current sensor connection portion 86 of the third energization bus bar 82, the lead terminal 52b protruding toward the left from the current sensor 18 is superposed on the current sensor connection portion 86 from below, and the current sensor connection portion 86 and the lead terminal 52b are connected using a bolt 50.

As a result, the relay 14, the fuse 16, and the current sensor 18 are electrically connected in series by the first to fourth energization bus bars 56, 72, 82, 90. The external connection portion 60a, which can be connected to an unshown external circuit terminal, is formed in the left end portion, and the external connection portion 60b, which can be connected to an unshown external circuit terminal, is formed in the right end portion. In addition, the heat transfer portions 68 of the first and second cooling members 64, 78 are disposed on the bottom surface of the relay 14 so as to be respectively in contact with a right part and left part thereof, covering the substantially the entire surface thereof.

In such a manner, the relay 14, the fuse 16, and the current sensor 18 are electrically connected in series by the first to fourth energization bus bars 56, 72, 82, 90, and the heat transfer portions 68 of the first and second cooling members 64, 78 are disposed in contact with the bottom surface of the relay 14. These members are housed into, from above, the base member 12 having the first heat-conducting member 36a, 36b, 36c and the second heat-conducting members 38a, 38b, 38c arranged thereon. Note that, when the housing is performed, the heat transfer portion 68 of the first cooling member 64, the heat transfer portion 68 of the second cooling member 78, the heat-dissipating portion 88 of the third energization bus bar 82, and the heat-dissipating portion 94 of the fourth energization bus bar 90 are arranged in a state in which they are positioned so as to come into contact with the first heat-conducting members 36a, 36a, 36b, 36c from above, respectively.

Finally, the assembly of the circuit structure 10 is completed by covering the base member 12 formed in such a manner from above using the lid member 20. Consequently, the upper surface (i.e., the other surface) of each of the heat transfer portion 68 of the first cooling member 64 and the heat transfer portion 68 of the second cooling member 78 is in direct heat-conductive contact with the relay 14, which is a heat-generating component. The lower surface (i.e., the one surface) of each of the heat transfer portion 68 of the first cooling member 64, the heat transfer portion 68 of the second cooling member 78, the heat-dissipating portion 88 of the third energization bus bar 82, and the heat-dissipating portion 94 of the fourth energization bus bar 90 is in heat-conductive contact with the base member 12, which is a heat-dissipating body, via the first heat-conducting members 36a, 36a, 36b, 36c. Thus, the heat transfer portion 68 can be brought into heat-conductive contact with the relay 14 and the base member 12 at a position closest to the relay 14, and efficient dissipation of heat from the relay 14 can be realized. Here, the parts of the bottom wall 22 of the base member 12 constituting the case that form the bottom surfaces 32 of the first-heat-conducting-member-housing portions 28a, 28b, 28c, which are the contact parts that come into contact with the heat transfer portions 68 and the heat-dissipating portions 88, 94, are thinner than the vicinity thereof. Thus, it is possible to facilitate heat transfer of the heat transfer portions 68 and the heat-dissipating portions 88, 94. In addition, the level differences 104 are formed around parts that constitute the bottom surfaces 32, and the first heat-conducting members 36a, 36b, 36c are positioned in the first heat-conducting member storage portions 28a, 28b, 28c, which are contact parts, by the level differences 104. Therefore, displacement of the first heat-conducting members 36a, 36b, 36c is prevented, and it is possible to reliably avoid unexpected conduction between the heat transfer portions 68 and the heat-dissipating portions 88, 94 and nearby members. Furthermore, the upper surface (i.e., the other surface) of each of the heat transfer portion 68 of the first cooling member 64 and the heat transfer portion 68 of the second cooling member 78 is in heat-conductive contact with the bottom surface of the relay 14, which is a heat-generating component. That is, the first heat-conducting members 36a are interposed between contact surfaces of the base member 12 and the relay 14, which is a heat-generating component. Note that the heat-dissipating portion 88 of the third energization bus bar 82 is in heat-conductive contact with the fuse 16 and the current sensor 18, which are heat-generating components, via the third energization bus bar 82 and the lead terminals 52a, 52b, and is in heat-conductive contact with the base member 12, which is a heat-dissipating body, via the first heat-conducting member 36b. Furthermore, the heat-dissipating portion 94 of the fourth energization bus bar 90 is in heat-conductive contact with the current sensor 18, which is a heat-generating component, via the fourth energization bus bar 90 and the lead terminal 52b, and is in heat-conductive contact with the base member 12, which is a heat-dissipating body, via the first heat-conducting member 36c.

Additionally, as illustrated in FIG. 6, the bottom surface 32 of each first-heat-conducting-member-housing portion 28a, which is the contact part of the base member 12 that comes into contact with the heat transfer portion 68 of the first cooling member 64 (the second cooling member 78), comes into heat-conductive contact with the other member 108 (for example, a metal case of a battery pack), that is a heat-dissipating body on the outer surface side of the base member 12, via the second heat-conducting member 38a. That is, the second heat-conducting member 38a is interposed between contact surfaces of the base member 12 and the other member 108. Thus, it is possible to even more favorably promote dissipation of heat from the relay 14, which is a heat-generating component, to the other member 108 via the heat transfer portion 68 of the first cooling member 64 (the second cooling member 78), which is a cooling member. In addition, the level differences 106 are formed around parts constituting the bottom surfaces 34, and the second heat-conducting members 38a, 38b, 38c are positioned in the second-heat-conducting-member-housing portions 30a, 30b, 30c, which are contact parts, by the level differences 106. Therefore, displacement of the second heat-conducting members 38a, 38b, 38c is prevented, and it is possible to reliably avoid unexpected conduction between the heat transfer portions 68 and the heat-dissipating portions 88, 94 and nearby members.

Additionally, the actions and effects of the present embodiment will be described. According to the present embodiment, members that are connected to the first power terminal 42 and the second power terminal 44, which are connection portions of the relay 14 (heat-generating component), are separated into the first energization bus bar 56 and the second energization bus bar 72, which are energization bus bars, and the first cooling member 64 and the second cooling member 78, which are cooling members. Heat from the relay 14 is dissipated from the heat-transfer portions 68 provided in the first and second cooling members 64, 78 through the base member 12, which is a heat-dissipating body that comes into heat-conductive contact with the heat-transfer portions 68. Thus, it is not necessary to form an energization bus bar extending over a long distance so as to be thick over the entire length thereof as in a conventional structure in which a heat-transfer portion is provided in an energization bus bar in order to increase the thermal capacity. In particular, at the first power terminal 42, a direction in which the first energization bus bar 56 that is connected to the first power terminal 42 extends and a direction in which the first cooling member 64 that is connected to the first power terminal 42 extends are different from each other. In addition, at the second power terminal 44, a direction in which the second energization bus bar 72 that is connected to the second power terminal 44 extends and a direction in which the second cooling member 78 that is connected to the second power terminal 44 extends are different from each other. As a result, for example, components can be linked at the shortest distance such that the first and second energization bus bars 56, 72 have low resistance, and the first and second cooling members 64, 78 can be connected to the heat-dissipating body in the shortest distance. Thus, it is possible to decrease the length and the thickness of the energization bus bar, and to decrease the cost of the energization bus bar. In addition, the first and second cooling members 64, 78 in which the heat-transfer portions 68 are provided only require connection between the relay 14 (heat-generating component) and the base member 12 (heat-dissipating body), and thus can be realized with a very simple configuration. By separating members for the energization bus bar and the cooling member in this manner, the structure is simplified, and can be formed with a high yield rate, and it is possible to decrease the size of the entire circuit structure, and decrease the cost accordingly.

In addition, the bolt fastening portions 58, 74 of the first and second energization bus bars 56, 72 and the bolt fastening portions 66, 80 of the first and second cooling members 64, 78 are superimposed on and connected to the first power terminal 42 and the second power terminal 44 of the relay 14. Thus, it is possible to increase the thermal capacity in the first and second power terminals 42, 44 constituting the connection portions of the relay 14, and thus, even when a sudden large current occurs, it is possible to sufficiently resist heat generated by such a large current. Moreover, the bolt fastening portions 58, 74 of the first and second energization bus bars 56, 72 are disposed on the first and second power terminal 42, 44 (connection portions of the relay 14) side relative to the bolt fastening portions 66, 80 of the first and second cooling members 64, 78. Thus, the first and second energization bus bars 56, 72 can be connected with lower resistance to the first and second power terminals 42, 44, which are the connection portions of the relay 14, and thus it is possible to avoid a loss and realize a circuit structure that generates less heat.

The bolt insertion hole 70 has tolerance-absorbing spaces ($a_1$ and $a_2$ in FIG. 6) above and below the screw portion 50a of the bolt 50, and thus the heat transfer portion 68 extending from the bottom end portion of the bolt fastening portion 58 can reliably come into contact with the bottom surface of the main body 40 of the relay 14. Therefore, contact between the heat transfer portions 68 provided in the first and second cooling members 64, 78 and the relay 14, which is a heat-generating component, is reliably realized, and it is possible to stably realize dissipation of heat from the heat-generating component.

Embodiment 2

Figure 11:
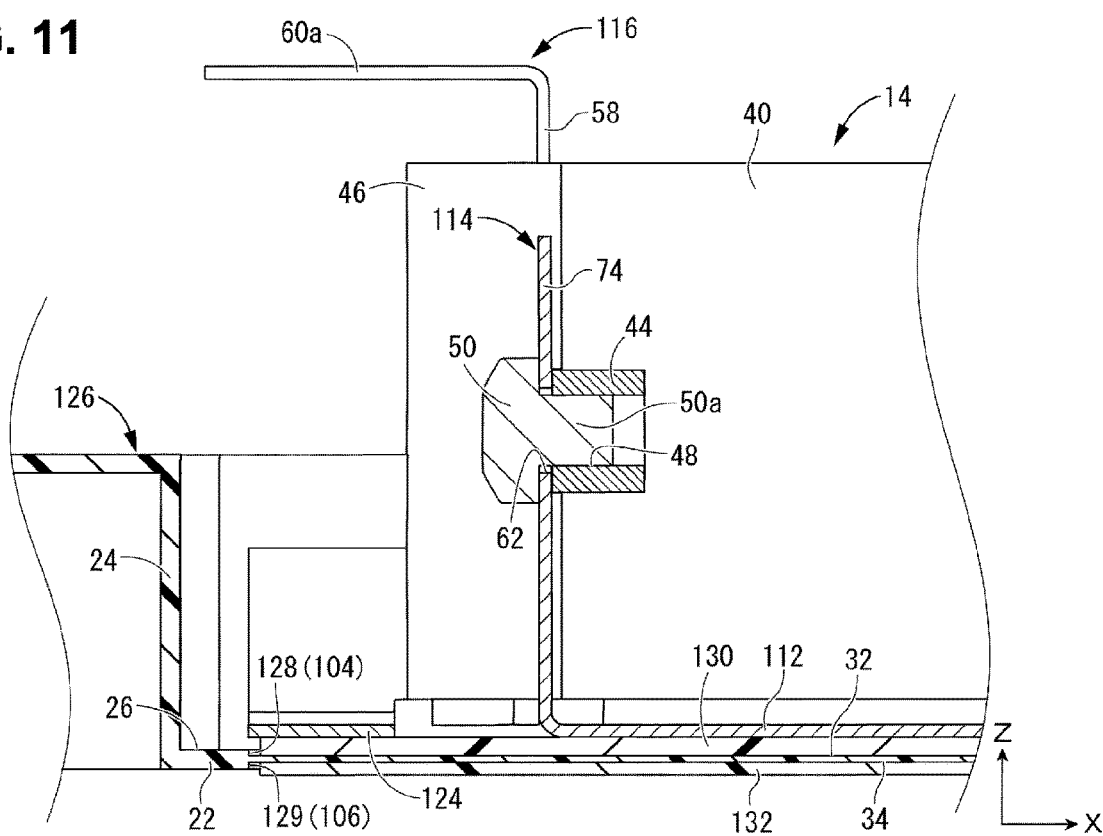
FIG. 11 is a vertical cross-sectional view illustrating, in an enlarged manner, main constituent elements of the circuit structure with the lid member detached therefrom, and is a diagram corresponding to a cross-section taken along line XI-XI in FIG. 8.

Embodiment 2 in which a technique disclosed in the present description is applied to a circuit structure 110 will be described with reference to FIGS. 7 to 13. As a whole, the circuit structure 110 according to Embodiment 2 has substantially the same structure as that of the circuit structure 10 according to Embodiment 1 above, but is different from the circuit structure 10 according to Embodiment 1 mainly in that, as illustrated in FIG. 11, a second energization bus bar 114, which is an energization bus bar that includes a heat dissipating portion 112, is connected to the second power terminal 44, which is the other connection portion of the relay 14. Note that, in Embodiment 2, members and parts that are substantially the same as those in Embodiment 1 above are given the same reference numerals as Embodiment 1 above in drawings, and thus a detailed description thereof is omitted.

Figure 12:
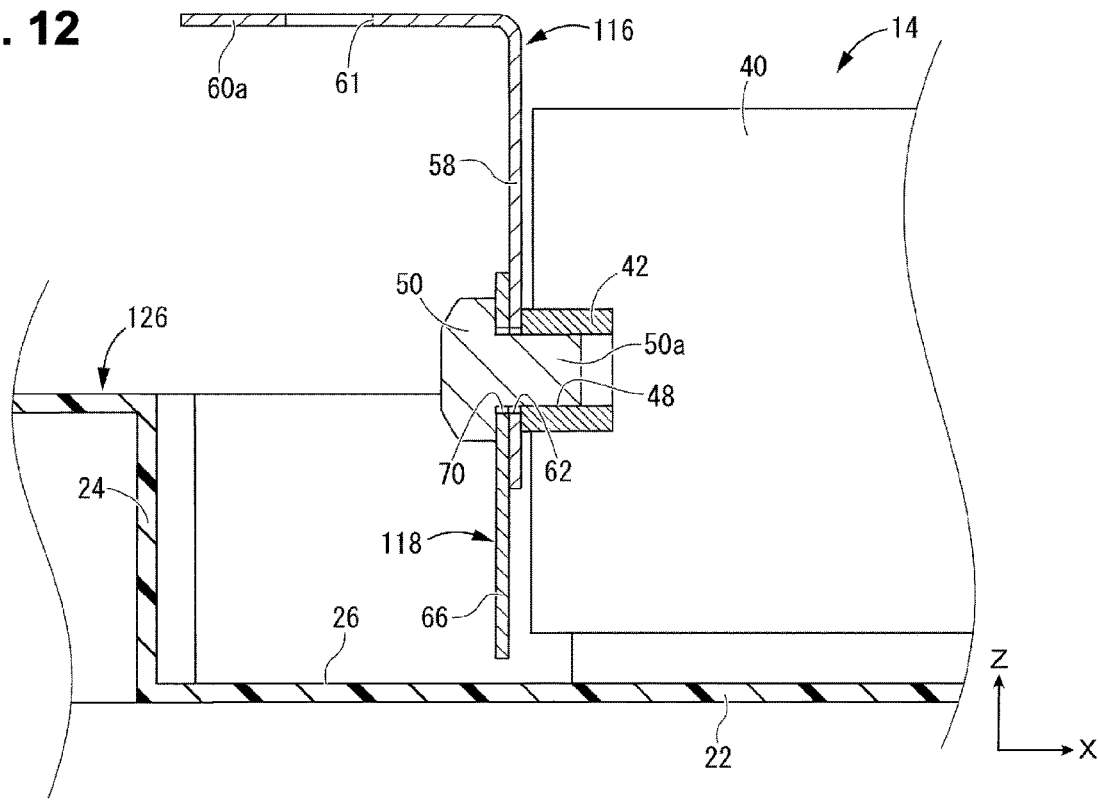
FIG. 12 is a vertical cross-sectional view illustrating, in an enlarged manner, main constituent elements of the circuit structure with the lid member detached therefrom, and is a diagram corresponding to a cross-section taken along line XII-XII in FIG. 8.
Figure 13:
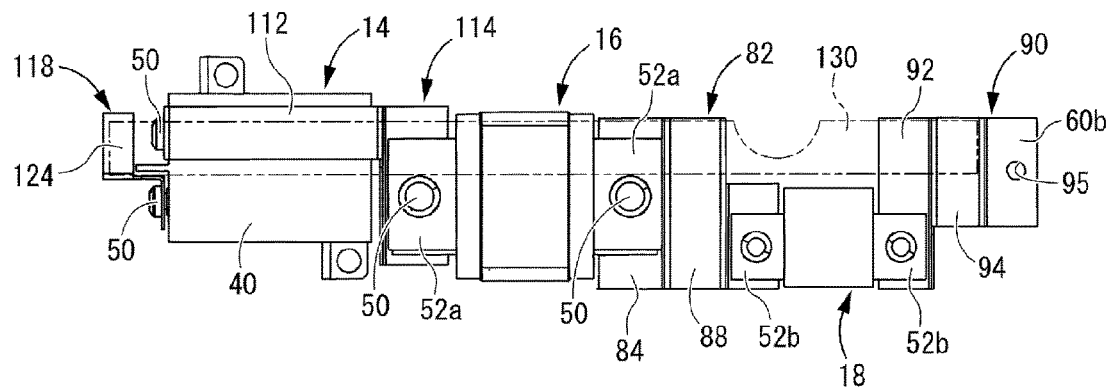
FIG. 13 is a bottom surface diagram illustrating a state where the case and first and second heat-conducting members are removed from the circuit structure illustrated in FIG. 7.

Also as illustrated in FIG. 12, a first energization bus bar 116, which is an energization bus bar, and a cooling member 118 formed separately from the first energization bus bar 116 are connected to the first power terminal 42, which is the one connection portion of the relay 14. Note that, in Embodiment 2, the relay 14 is oriented to the left.

The first energization bus bar 116 according to Embodiment 2 bends in an L shape as a whole. The upper end portion of the first energization bus bar 116 spreads out in the horizontal direction (XY plane), and the right end portion extends in the top-bottom direction (YZ plane). The upper end portion of the first energization bus bar 116 that spreads out in the horizontal direction is the external connection portion 60a that includes the bolt insertion hole 61. In addition, the right end portion of the first energization bus bar 116 that extends in the top-bottom direction is the bolt fastening portion 58 that includes the bolt insertion hole 62.

In the upper bottom-wall portion 96 of the lid member 120 of Embodiment 2, a insertion groove 122 into which the bolt fastening portion 58 of the first energization bus bar 116 is inserted is formed so as to penetrate the upper bottom-wall portion 96 in the thickness direction (the top-bottom direction) thereof. Accordingly, when the bolt fastening portion 58 of the first energization bus bar 116 is inserted into the insertion groove 122 in the lid member 120 from above, the bolt fastening portion 58 protrudes downward from the upper bottom-wall portion 96, and when the circuit structure 110 is being assembled, the bolt insertion hole 62 and the first power terminal 42 are aligned with each other. In addition, the external connection portion 60a of the first energization bus bar 116 is superposed on the upper bottom-wall portion 96 of the lid member 120 and is exposed to the outside.

The right end portion of the cooling member 118 spreads out in the top-bottom direction (YZ plane). This right end portion that spreads out in the top-bottom direction is the bolt fastening portion 66 that includes the bolt insertion hole 70. Specifically, when the circuit structure 110 is being assembled, the bolt insertion hole 70 of the cooling member 118, the bolt insertion hole 62 of the first energization bus bar 116, and the bolt hole 48 of the first power terminal 42 are aligned with each other, and the bolt 50 is inserted and fastened. Thus, the first energization bus bar 116 and the cooling member 118 are fixed to the first power terminal 42 of the relay 14, and are electrically and thermally connected. Furthermore, a heat-transfer portion 124 that spreads out in the horizontal direction is provided in the left end portion of the cooling member 118. This heat-transfer portion 124 extends forward past the bolt fastening portion 66.

The second energization bus bar 114 according to Embodiment 2 extends in the left-right direction as a whole. That is, the left end portion of the second energization bus bar 114 is the bolt fastening portion 74 that spreads out in the top-bottom direction (YZ plane), and the right end portion of the second energization bus bar 114 is the fuse connection portion 76 that spreads out in the horizontal direction. Therefore, when the circuit structure 110 is being assembled, the bolt insertion hole 62 of the bolt fastening portion 74 in the second energization bus bar 114 and the bolt hole 48 of the second power terminal 44 in the relay 14 are aligned, and the bolt 50 is inserted and fastened. Thus, the second energization bus bar 114 is electrically and thermally connected to the second power terminal 44 of the relay 14. In addition, the fuse connection portion 76 of the second energization bus bar 114 and the lead terminal 52a that protrudes to the left from the fuse 16 are superposed on each other and fastened using the bolt 50.

A heat dissipating portion 112 that spreads out in the horizontal direction is provided between the bolt fastening portion 74 and the fuse connection portion 76. The heat dissipating portion 112 is positioned below the bolt insertion hole 62 in the bolt fastening portion 74 and the fuse connection portion 76. Thus, when the circuit structure 110 is being assembled, when the second energization bus bar 114 is connected between the relay 14 and the fuse 16, the heat dissipating portion 112 is positioned below the relay 14. As will be described later, the heat dissipating portion 112 is in heat-conductive contact with a base member 126 via a first heat-conducting member 130. In other words, the second energization bus bar 114 is routed between the relay 14 and the first heat-conducting member 130.

The base member 126 according to Embodiment 2 has a shape similar to that of the base member 12 according to Embodiment 1 above as a whole, but the shape of a first-heat-conducting-member-housing portion 128 is different from that in Embodiment 1. Specifically, the first-heat-conducting-member-housing portion 128 according to Embodiment 2 has a substantially rectangular shape extending in the left-right direction as a whole. This first-heat-conducting-member-housing portion 128 is formed over substantially the entire length in the left-right direction of the upper surface 26 of the bottom wall 22. Note that a cut-out recessed portion is provided in the first-heat-conducting-member-housing portion 128 in order to secure a region in the lid member 120 in which the bolt insertion holes 102 are to be formed. Also in Embodiment 2, the first-heat-conducting-member-housing portion 128 is formed by providing the level difference 104 on the upper surface 26 of the bottom wall 22. In addition, a second-heat-conducting-member-housing portion 129 having the same shape as the first-heat-conducting-member-housing portion 128 is also formed by providing the level difference 106 on the lower surface of the bottom wall 22. In particular, in Embodiment 2, the first-heat-conducting-member-housing portion 128 and the second-heat-conducting-member-housing portion 129 are provided biased on one side (front side) in the front-rear direction of the base member 126. That is, the width in the front-rear direction of the first-heat-conducting-member-housing portion 128 is smaller than or equal to half the width in front-rear direction of the base member 126.

The first heat-conducting member 130 and a second heat-conducting member 132 having the same shape as the first-heat-conducting-member-housing portion 128 and the second-heat-conducting-member-housing portion 129 are housed in the first-heat-conducting-member-housing portion 128 and the second-heat-conducting-member-housing portion 129, and are firmly fixed using an adhesive or the like. Also in Embodiment 2, the first and second heat-conducting members 130, 132 are formed in the form of a heat conduction sheet, and are provided with a cut-out recessed portion similarly to the first-heat-conducting-member-housing portion 128 and the second-heat-conducting-member-housing portion 129.

Assembly Process of Circuit Structure 110

Next, one example of an assembly process of the circuit structure 110 will be described. The assembly process of the circuit structure 110 is not limited by the following description.

First, the lid member 120 and the first energization bus bar 116 are prepared. The bolt fastening portion 58 of the first energization bus bar 116 is then inserted into the insertion groove 122 provided in the upper bottom-wall portion 96 of the lid member 120, and a bolt is inserted into the bolt insertion hole 61 and is fastened to the lid member 120 as necessary, whereby the lid member 120 and the first energization bus bar 116 are fixed.

Also, the relay 14 and the second energization bus bar 114 are prepared, and the second energization bus bar 114 is fixed to the second power terminal 44 of the relay 14 by the bolt 50. The lid member 120 is vertically reversed, and the relay 14 to which the second energization bus bar 114 is fixed, the third energization bus bar 82, and the fourth energization bus bar 90 are placed on the upper bottom-wall portion 96 of the lid member 120. The fuse 16 and the current sensor 18 are also placed thereon from above. The relay 14 is then fixed to the lid member 120 by a bolt, and the fuse 16, the current sensor 18, and the second to fourth energization bus bars 114, 82, 90 are fixed to the lid member 120 by a bolt 50. Accordingly, the first power terminal 42 of the relay 14 and the bolt insertion hole 62 of the first energization bus bar 116 are aligned with each other.

Furthermore, the bolt fastening portion 66 of the cooling member 118 is inserted from above the lid member 120, and the bolt hole 48 of the first power terminal 42, the bolt insertion hole 62 of the first energization bus bar 116, and the bolt insertion hole 70 of the cooling member 118 are aligned with each other. The bolt 50 is then inserted into the bolt hole 48 and the bolt insertion holes 62, 70 and is fastened, and the first energization bus bar 116 and the cooling member 118 are fixed to the relay 14. Note that an unshown through window is formed in the left end of the peripheral wall portion 98 of the lid member 120, and, even in a state in which the relay 14 is fixed to the lid member 120, the bolt 50 can be fastened to the first and second power terminals 42, 44 from the left side.

Next, the base member 126 to which the first and second heat-conducting members 130, 132 are firmly fixed is attached to the upper opening portion of the lid member 120 to which the relay 14, the fuse 16, the current sensor 18, the first to fourth energization bus bars 116, 114, 82, 90, and the cooling member 118 are fixed. In addition, a case 134 that includes the lid member 120 and the base member 126 is formed by fixing the lid member 120 and the base member 126 using a conventionally known fixing method such as adhesion, welding, protrusion-recess fitting, or press fitting. The circuit structure 110 is completed by vertically reversing this case 134.

Note that the above-described assembly process of the circuit structure 110 is merely one specific example, and does not limit the assembly process of the circuit structure 110. The second energization bus bar 114 does not need to be fixed to the relay 14 in advance, for example, and a configuration may also be adopted in which, when the bolt 50 is fastened to the first power terminal 42 and the first energization bus bar 116 and the cooling member 118 are fixed to the relay 14, the bolt 50 is fastened to the second power terminal 44 and the relay 14 and the second energization bus bar 114 are fixed.

In the circuit structure 110 manufactured as described above, the heat-transfer portion 124 provided in the cooling member 118 protrudes forward, in other words on the second power terminal 44 (the second energization bus bar 114) side, and is in proximity to the heat dissipating portion 112 provided in the second energization bus bar 114, on the front side of the case 134. Moreover, in Embodiment 2, the heat-transfer portion 124 and the heat dissipating portion 112 are in heat-conductive contact with the case 134 (the base member 126) via one first heat-conducting member 130. In particular, in Embodiment 2, not only the heat-transfer portion 124 and the heat dissipating portion 112, but also the heat dissipating portion 88 provided in the third energization bus bar 82 and the heat dissipating portion 94 provided in the fourth energization bus bar 90 are in heat-conductive contact with the case 134 (the base member 126) via the same one first heat-conducting member 130. Specifically, in FIG. 13, the first heat-conducting member 130 indicated by one dotted chain line is in contact with substantially the entire surfaces of the heat-transfer portion 124 and the heat dissipating portion 112, and is in contact with portions (front portions) of the heat dissipating portions 88 and 94.

Also in the circuit structure 110 according to Embodiment 2, the cooling member 118 formed separately from the first energization bus bar 116 is provided, and heat generated by the relay 14 is dissipated from the case 134 through the heat-transfer portion 124 provided in the cooling member 118, and thus effects similar to those of Embodiment 1 above can be exhibited.

In particular, in Embodiment 2, the heat-transfer portion 124 and the heat dissipating portion 112 are in contact with one first heat-conducting member 130, and thus, the number of assembly processes can be decreased compared with a case in which separate first heat-conducting members 36a are provided for a pair of heat-transfer portions 68 as in Embodiment 1 above. In addition, in Embodiment 2, the heat dissipating portion 112 has a shape elongated in the left-right direction, and thus, even when a first heat-conducting member that comes into contact with the heat-transfer portion 124 and the heat dissipating portion 112 is provided, the length in the front-rear direction of the first heat-conducting member can be kept small. Therefore, for example, compared with a case where one first heat-conducting member according to Embodiment 1 above that comes into contact with both of the heat-transfer portions 68 is provided, it is possible to decrease the total area of the first heat-conducting member.

Moreover, in Embodiment 2, not only the heat-transfer portion 124 and the heat dissipating portion 112, but also the heat dissipating portion 88 of the third energization bus bar 82 and the heat dissipating portion 94 of the fourth energization bus bar 90 are in contact with the same first heat-conducting member 130. Therefore, compared with a case in which the separate first heat-conducting members 36a, 36a, 36b, 36c are provided for a pair of heat-transfer portions 68 and the heat dissipating portions 88 and 94 as in Embodiment 1 above, the number of assembly processes can be further decreased. In particular, in Embodiment 1 above, when one first heat-conducting member having a size large enough to be in contact with a pair of heat-transfer portions 68 and the heat dissipating portions 88 and 94 over the entire surfaces thereof is provided, a first heat-conducting member having a size large enough to substantially cover the entire surface of the bottom wall 22 of the base member 12 is necessary. In contrast, in Embodiment 2, it is possible to keep the total area of the first heat-conducting member small while allowing the first heat-conducting member 130 to be in contact with all of the heat-transfer portion 124 and the heat dissipating portions 112, 88, 94, by forming the first heat-conducting member 130 in the shape of a rectangle with a substantially constant width (length in the front-rear direction).

Furthermore, in Embodiment 2, the second energization bus bar 114 is routed between the relay 14 and the first heat-conducting member 130. Thus, a portion of the second energization bus bar 114 that is positioned between the relay 14 and the first heat-conducting member 130 can serve as the heat dissipating portion 112, and, in the second energization bus bar 114, a heat dissipating portion 112 that comes into contact with the first heat-conducting member 130 can be favorably formed. Note that, in Embodiment 2, the bottom surface of the relay 14 and the heat dissipating portion 112 are slightly spaced apart, but, for example, if the bolt insertion hole 62 in the bolt fastening portion 74 of the second energization bus bar 114 has an elongated circular shape like the bolt insertion holes 70 of the first and second cooling members 64 and 78 in Embodiment 1 above, it is also possible to adjust the relative positions of the relay 14 and the second energization bus bar 114 in the top-bottom direction. Thus, it is also possible to bring the bottom surface of the relay 14 and the heat dissipating portion 112 into contact with each other, and improve the heat transfer efficiency.

OTHER EMBODIMENTS

The technique disclosed in the present description is not limited to the embodiment described based on the description above and the drawings, and embodiments such as those described below are also included in the technical scope of the technique disclosed in the present description.

(1) The circuit structures 10, 110 according to the present disclosure have been described in which the relay 14 is used as an example of a heat-generating component, but any component that generates heat when energized can be applied, as a heat-generating component, to any component such as the fuse 16 or the current sensor 18. In addition, the connection structure of the first and second energization bus bars 56, 116, 72, 114 for connection to the first and second power terminals 42, 44 that constitute the connection portion of the relay 14 has been described as a bolt fastening structure, but any other connection structure such as a press-fit structure can be adopted. Furthermore, dissipation of heat from the first and second cooling members 64, 78 and the cooling member 118 includes dissipation of heat from the first and second cooling members 64, 78 and the cooling member 118 itself, in addition to dissipation of heat from the heat-transfer portions 68, 124 provided in the first and second cooling members 64, 78 and the cooling member 118 through the base members 12, 126, which are heat-dissipating bodies that are in heat-conductive contact with the heat-transfer portions 68, 124.

(2) Furthermore, the shapes of the first and second cooling members 64 and 78 and the cooling member 118 are not limited to those disclosed in embodiments 1 and 2, and may be designed, as appropriate, according to arrangement positions of heat-generating components and other components, etc. For example, a shape in which through-holes are formed in the base member, and heat transfer portions and heat-dissipating portions directly come into contact with another member (such as a housing of a battery pack, for example) via the through-holes is also included.

(3) In the circuit structures 10, 110 according to the present disclosure, level differences 106 formed on the outer surface side of the base members 12, 126 constituting the cases are used to position the second heat-conducting members 38*a*, 38*b*, 38*c*, 132. However, there is no limitation to this. That is, it is sufficient that the second heat-conducting members 38*a*, 38*b*, 38*c*, 132 are positioned relative to the contact parts (the bottom surfaces 32 and 34) of the heat-transfer portions 68, 124 on the outer surface side of the base members 12, 126. For example, a configuration may be adopted such that the second heat-conducting members 38*a*, 38*b*, 38*c*, 132 are fixedly held by a positioning protrusion or recess that is provided in another member 108, such as a housing of a battery pack, to which the cases including the base members 12, 126 are fixedly attached, and the second heat-conducting members 38*a*, 38*b*, 38*c*, 132 are thus positioned relative to the contact parts (bottom surfaces 32, 34) that come into contact with the heat transfer portion 68 on the outer surface side of the base member 12, 126. Thus, it is possible to more stably promote the transfer of heat from the heat-transfer portions 68, 124.

(4) In the circuit structures 10, 110 according to the present disclosure, similar plates are described as plates made of metal that forms the first to fourth energization bus bars 56, 116, 72, 114, 82, 90, the first and second cooling members 64 and 78, and the cooling member 118, but there is no limitation to this. The first to fourth energization bus bars 56, 116, 72, 114, 82, 90, the first and second cooling members 64 and 78, and the cooling member 118 may also be formed from plates made of different metal materials. Copper that has high electrical conductivity and high heat conductivity may be selected for the first to fourth energization bus bars 56, 116, 72, 114, 82, 90, for example, and aluminum that has high heat conductivity and specific heat may be selected for the first and second cooling members 64 and 78 and the cooling member 118. Thus, it is possible to realize an increase in the resistances in the first to fourth energization bus bars 56, 116, 72, 114, 82, 90, and, even when a large current flows therethrough, it is possible to suppress a rise in the temperatures of the first and second cooling members 64 and 78 and the cooling member 118. Alternatively, the cooling member may also be made of a synthetic resin material that has high heat conductivity, or the like. In addition, the shape of the cooling member is not limited to a flat plate shape, and any shape can be adopted.

(5) In the circuit structure 10 of the Embodiment 1 of the present disclosure, the first and second energization bus bars 56 and 72 are fixed to the first and second power terminals 42, 44 that constitute connection portions, in a state of being disposed on the first and second power terminal 42, 44 (that constitute connection portions) side relative to the first and second cooling members 64 and 78, respectively, but there is no limitation to this. The first and second cooling members 64 and 78 may be fixed in a state of being disposed on the first and second power terminal 42, 44 (that constitute connection portions) side relative to the first and second energization bus bars 56 and 72, respectively. In addition, both the heat-transfer portions 68 of the first and second cooling members 64 and 78 are in contact with the bottom surface of the main body 40 of the relay 14, which is a heat-generating component, but do not necessarily need to be in contact therewith. A configuration may also be adopted in which, for example, the heat-transfer portion of the cooling member is in contact with the heat-dissipating body inside or outside the case, without being in contact with the heat-generating component.

(6) In Embodiment 2 above, the first heat-conducting member 130 that has a substantially rectangular shape with a substantially constant length in the width direction (the front-rear direction) is adopted, but the length in the width direction of the first heat-conducting member may be partially increased. That is, for example, the length in the width direction of a portion of the first heat-conducting member according to Embodiment 2 that comes into contact with each of the heat dissipating portion 88 of the third energization bus bar 82 and the heat dissipating portion 94 of the fourth energization bus bar 90 may be increased, and the first heat-conducting member may be in contact with the heat dissipating portions of the third and fourth energization bus bars over the entire surface of the first heat-conducting member.

(7) In Embodiment 2 above, the cooling member 118 is connected to the first power terminal 42, and the heat-transfer portion 124 extends toward the second power terminal 44 (the second energization bus bar 114), in other words, the front side, but there is no limitation to this aspect. A configuration may also be adopted in which, for example, the cooling member is connected to the second power terminal, the energization bus bar that includes the heat dissipating portion is connected to the first power terminal, and the heat-transfer portion extends to the rear.

LIST OF REFERENCE NUMERALS

- 10 Circuit structure (embodiment 1)
- 12 Base member (case)
- 14 Relay (heat-generating component)
- 16 Fuse (heat-generating component)
- 18 Current sensor (heat-generating component)
- 20 Lid member (case)
- 22 Bottom wall
- 24 Peripheral wall
- 26 Upper surface
- 28a-28c First-heat-conducting-member-housing portion
- 30a-30c Second-heat-conducting-member-housing portion
- 32 Bottom surface (contact part)
- 34 Bottom surface (contact part)
- 36a-36c First heat-conducting member
- 38a-38c Second heat-conducting member
- 40 Main body
- 42 First power terminal (connection portion)
- 44 Second power terminal (connection portion)
- 46 Insulating plate
- 48 Bolt hole
- 50 Bolt
- 50a Screw portion
- 52a, 52b Lead terminal (connection portion)
- 54a, 54b Insertion hole
- 56 First energization bus bar (energization bus bar)
- 58 Bolt fastening portion
- 60a, 60b External connection portion
- 61 Bolt insertion hole
- 62 Bolt insertion hole
- 64 First cooling member (cooling member)
- 66 Bolt fastening portion
- 68 Heat-transfer portion
- 70 Bolt insertion hole
- 72 Second energization bus bar (energization bus bar)
- 74 Bolt fastening portion
- 76 Fuse connection portion
- 77 Bolt insertion hole
- 78 Second cooling member (cooling member)
- 80 Bolt fastening portion
- 82 Third energization bus bar (energization bus bar)
- 84 Fuse connection portion
- 86 Current sensor connection portion
- 88 Heat dissipating portion
- 90 Fourth energization bus bar (energization bus bar)
- 92 Current sensor connection portion
- 94 Heat dissipating portion
- 95 Bolt insertion hole
- 96 Upper bottom-wall portion
- 98 Peripheral wall portion
- 100a, 100b Opening portion
- 102 Bolt insertion hole
- 104, 106 Level difference
- 108 Other member
- 110 Circuit structure (embodiment 2)
- 112 Heat dissipating portion
- 114 Second energization bus bar (energization bus bar)
- 116 First energization bus bar (energization bus bar)
- 118 Cooling member
- 120 Lid member
- 122 Insertion groove
- 124 Heat-transfer portion
- 126 Base member
- 128 First-heat-conducting-member-housing portion
- 129 Second-heat-conducting-member-housing portion
- 130 First heat-conducting member
- 132 Second heat-conducting member
- 134 Case

The invention claimed is:

1. A circuit structure comprising:
   a heat-generating component that generates heat when energized;
   an energization bus bar that is connected to a connection portion of the heat-generating component;
   a cooling member that is formed separately from the energization bus bar, and is connected to the connection portion of the heat-generating component along with the energization bus bar; and
   a heat transfer portion that is provided in the cooling member, and is in heat-conductive contact with a heat-dissipating body,
   wherein a direction in which the energization bus bar extends from the connection portion of the heat-generating component and a direction in which the cooling member extends from the connection portion of the heat-generating component are different, and
   wherein an external connection portion of the energization bus bar extends in a plane parallel to, and in a same direction as, the heat transfer portion of the cooling member.

2. The circuit structure according to claim 1,
   wherein, at the connection portion of the heat-generating component, the energization bus bar is disposed on the connection portion side relative to the cooling member.

3. The circuit structure according to claim 1, further comprising:
   a case that houses the energization bus bar, the cooling member, and the heat-generating component,
   wherein the cooling member is in heat-conductive contact with the heat-generating component, at the connection portion, and the heat transfer portion is in heat-conductive contact with the case, which is the heat-dissipating body.

4. The circuit structure according to claim 3, further comprising:
a first heat-conducting member that is interposed between contact surfaces of the heat transfer portion and the case,
wherein the first heat-conducting member is positioned relative to a contact part of the case that comes into contact with the heat transfer portion.

5. The circuit structure according to claim 4,
wherein the contact part of the case that comes into contact with the heat transfer portion is in heat-conductive contact with another member that is the heat-dissipating body on an outer surface-side of the case,
the circuit structure further comprises a second heat-conducting member that is interposed between contact surfaces of the other member and the outer surface side of the case, and
the second heat-conducting member is positioned relative to the contact part on the outer surface side of the case.

6. The circuit structure according to claim 5,
wherein the contact part of the case that comes into contact with the heat transfer portion is thinner than the vicinity of the contact part in the case, and the second heat-conducting member is positioned relative to the contact part by a level difference that is formed at a boundary between the contact part and the vicinity.

7. The circuit structure according to claim 4,
wherein the contact part of the case that comes into contact with the heat transfer portion is thinner than the vicinity of the contact part in the case, and the first heat-conducting member is positioned relative to the contact part by a level difference that is formed at a boundary between the contact part and the vicinity.

8. The circuit structure according to claim 3,
wherein a contact part of the case that comes into contact with the heat transfer portion is thinner than the vicinity of the contact part in the case.

9. The circuit structure according to claim 1,
wherein the energization bus bar and the cooling member are made of different materials.

10. The circuit structure according to claim 1,
wherein the heat transfer portion of the cooling member is in heat-conductive contact with the heat-generating component.

11. The circuit structure according to claim 10,
wherein the cooling member includes a bolt fastening portion that is bolted to the connection portion, and
a bolt insertion hole provided in the bolt fastening portion includes a tolerance-absorbing space that absorbs the tolerance of the heat-generating component and allows the heat transfer portion to come into contact with the heat-generating component.

12. The circuit structure according to claim 1, further comprising:
a case that houses the energization bus bar, the cooling member, and the heat-generating component, and
a first heat-conducting member that is interposed between contact surfaces of the heat transfer portion and the case,
wherein a pair of connection portions are provided in the heat-generating component,
the energization bus bar and the cooling member formed separately from each other are connected to one of the connection portions,
an energization bus bar that includes a heat-dissipating portion is connected to the other connection portion, and
the heat transfer portion is extended toward the energization bus bar that includes the heat-dissipating portion and the heat transfer portion and the heat-dissipating portion are in heat-conductive contact with the case via the one first heat-conducting member.

13. The circuit structure according to claim 12,
wherein the energization bus bar connected to the other connection portion is routed between the heat-generating component and the first heat-conducting member.

14. The circuit structure according to claim 12, further comprising:
a plurality of heat-generating components,
wherein a plurality of energization bus bars that each include the heat-dissipating portion are thermally connected to the plurality of heat-generating components, and
the heat transfer portion and the plurality of heat-dissipating portions are in heat-conductive contact with the case via the one first heat-conducting member.

* * * * *